(12) United States Patent
Kuriyama et al.

(10) Patent No.: US 8,317,993 B2
(45) Date of Patent: Nov. 27, 2012

(54) PLATING METHOD AND APPARATUS

(75) Inventors: Fumio Kuriyama, Tokyo (JP); Rei Kiumi, Tokyo (JP); Nobutoshi Saito, Tokyo (JP); Takashi Takemura, Tokyo (JP); Masaaki Kimura, Tokyo (JP); Sachiko Takeda, Tokyo (JP); Yugang Guo, Tokyo (JP)

(73) Assignee: Ebara Corporation, Tokyo (JP)

( * ) Notice: Subject to any disclaimer, the term of this patent is extended or adjusted under 35 U.S.C. 154(b) by 157 days.

(21) Appl. No.: 12/461,613

(22) Filed: Aug. 18, 2009

(65) Prior Publication Data
US 2009/0311429 A1 Dec. 17, 2009

Related U.S. Application Data

(62) Division of application No. 10/571,751, filed as application No. PCT/JP2004/014698 on Sep. 29, 2004, now abandoned.

(30) Foreign Application Priority Data

Oct. 2, 2003 (JP) .................................. 2003-345062
Feb. 12, 2004 (JP) .................................. 2004-035594

(51) Int. Cl.
*C25D 7/12* (2006.01)
*C25D 5/48* (2006.01)
*C02F 1/461* (2006.01)
*C25B 1/00* (2006.01)

(52) U.S. Cl. ........ 205/220; 205/210; 205/746; 134/902; 134/27; 134/29

(58) Field of Classification Search .................. None
See application file for complete search history.

(56) References Cited

U.S. PATENT DOCUMENTS

| 4,505,786 | A | | 3/1985 | Birkmaier et al. |
| 4,898,650 | A | | 2/1990 | Wu et al. |
| 5,215,593 | A | | 6/1993 | Nojo et al. |
| 5,676,760 | A | * | 10/1997 | Aoki et al. ............... 134/1.3 |
| 5,785,068 | A | | 7/1998 | Sasaki et al. |
| 6,071,376 | A | * | 6/2000 | Nagamura et al. ........ 156/345.22 |
| 6,082,381 | A | | 7/2000 | Kamikawa et al. |

(Continued)

FOREIGN PATENT DOCUMENTS
DE        44 33 037        4/1995

(Continued)

OTHER PUBLICATIONS

International Search Report issued Apr. 20, 2005 in International (PCT) Application No. PCT/JP2004/014698, filed Sep. 29, 2004.
Database WPI Section Ch, Week 200235, Derwent Publications Ltd., London, GB; AN 2002-308534 XP 002312615.

*Primary Examiner* — Harry D Wilkins, III
(74) *Attorney, Agent, or Firm* — Wenderoth, Lind & Ponack, L.L.P.

(57) ABSTRACT

A plating apparatus has a steam treatment chamber configured to perform a steam treatment using steam on a surface of a substrate, and a plating chamber configured to plate the surface of the substrate subjected to the steam treatment. The plating apparatus also has an acid treatment chamber configured to bring the surface of the substrate subjected to the steam treatment into contact with an acid liquid. The plating apparatus includes a frame housing the steam treatment chamber, the acid treatment chamber, and the plating chamber.

11 Claims, 34 Drawing Sheets

U.S. PATENT DOCUMENTS

| | | |
|---|---|---|
| 6,136,163 A | 10/2000 | Cheung et al. |
| 6,399,022 B1 | 6/2002 | Schuler et al. |
| 6,555,170 B2 | 4/2003 | Taylor |
| 6,863,796 B2 * | 3/2005 | Chueh et al. .................. 205/220 |
| 6,969,456 B2 * | 11/2005 | Volodarsky et al. .......... 205/640 |
| 2002/0005214 A1 * | 1/2002 | Tomita et al. .................. 134/36 |
| 2002/0092542 A1 | 7/2002 | Park et al. |
| 2003/0003320 A1 | 1/2003 | Matsuo et al. |
| 2003/0092261 A1 | 5/2003 | Kondo et al. |
| 2003/0140949 A1 | 7/2003 | Sugimoto et al. |
| 2004/0069644 A1 | 4/2004 | Nelsen et al. |

FOREIGN PATENT DOCUMENTS

| | | |
|---|---|---|
| EP | 1 022 770 | 7/2000 |
| EP | 1 167 583 | 1/2002 |
| FR | 1 410 518 | 9/1965 |
| JP | 2001-274205 | 10/2001 |
| JP | 2002-212779 | 7/2002 |
| JP | 2003-231993 | 8/2003 |
| WO | 2004/081261 | 9/2004 |

* cited by examiner

F I G. 2
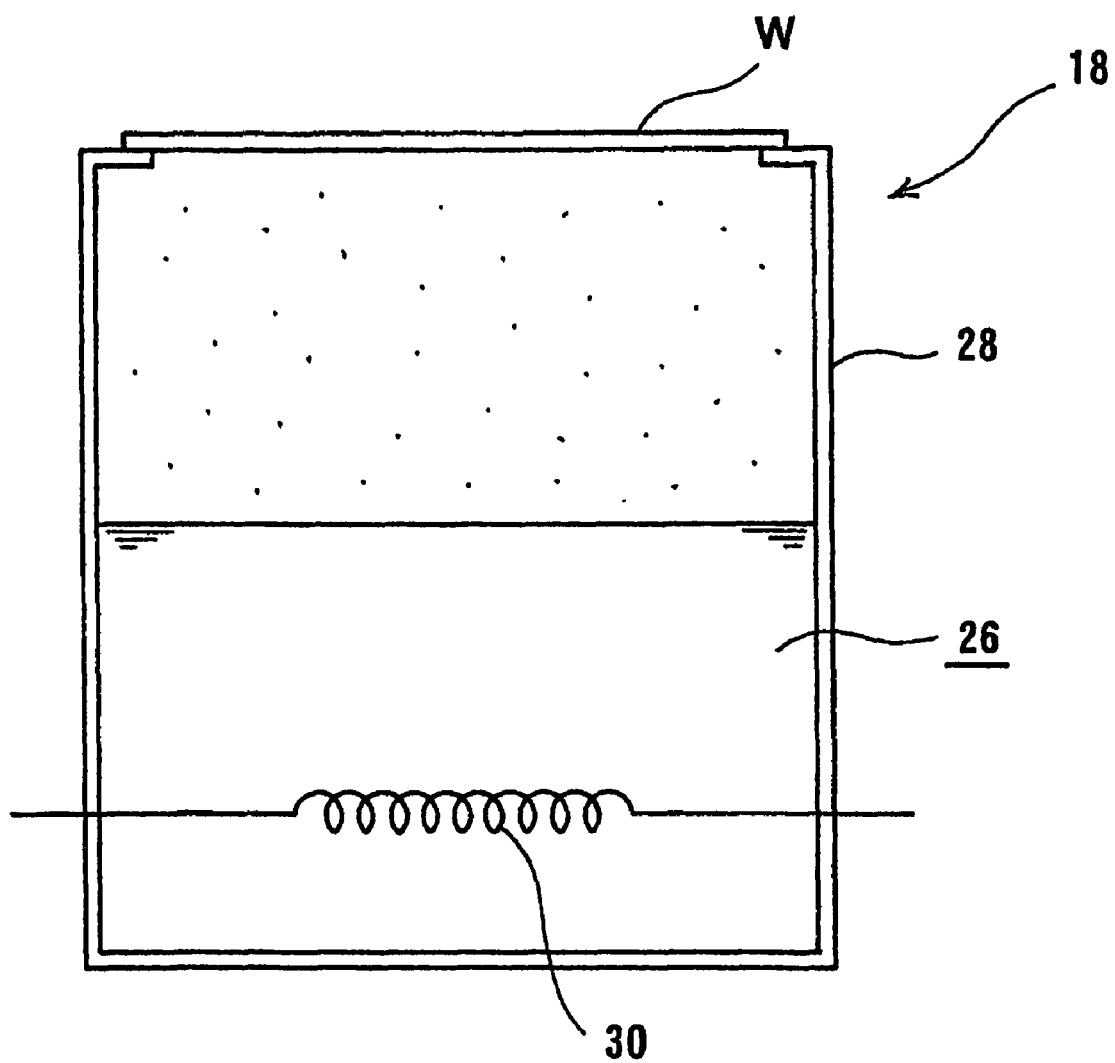

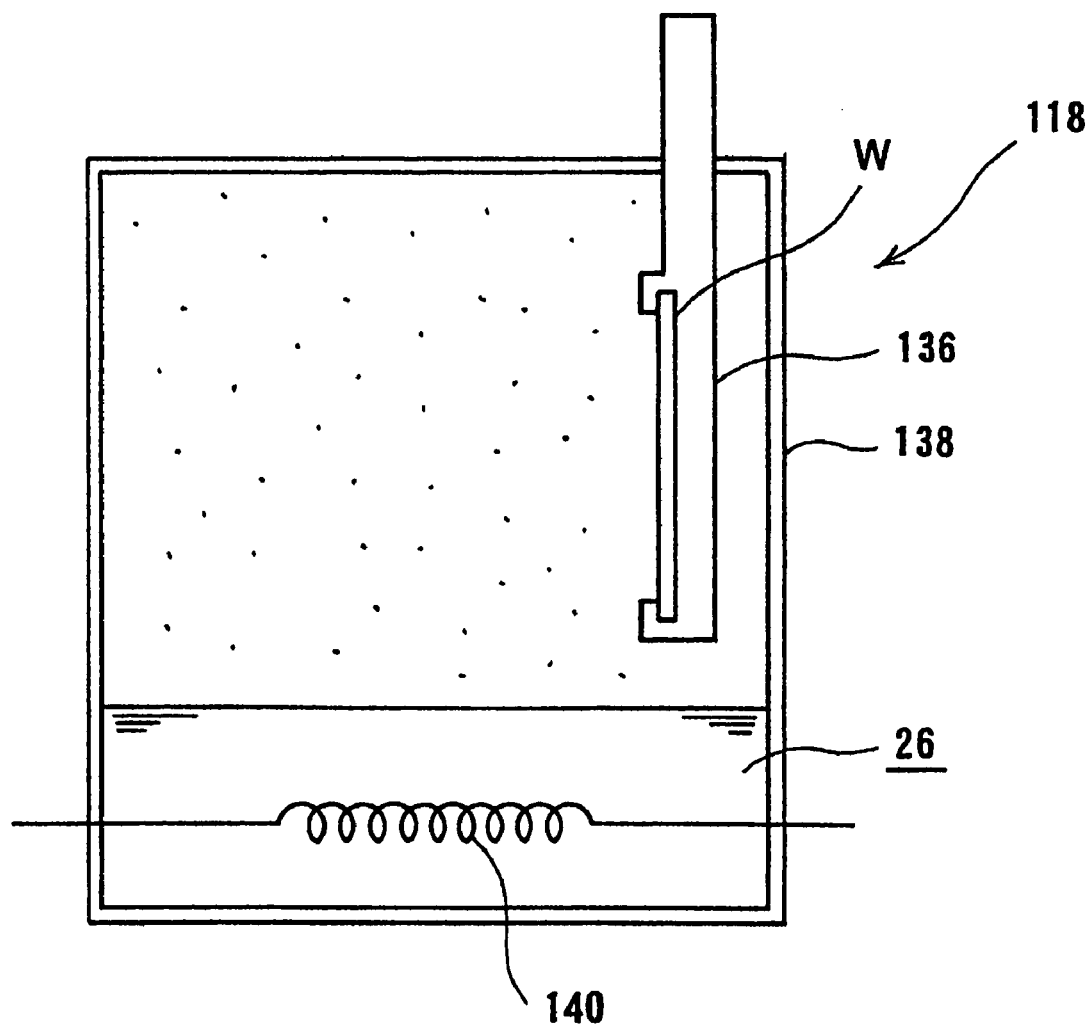
F I G. 7

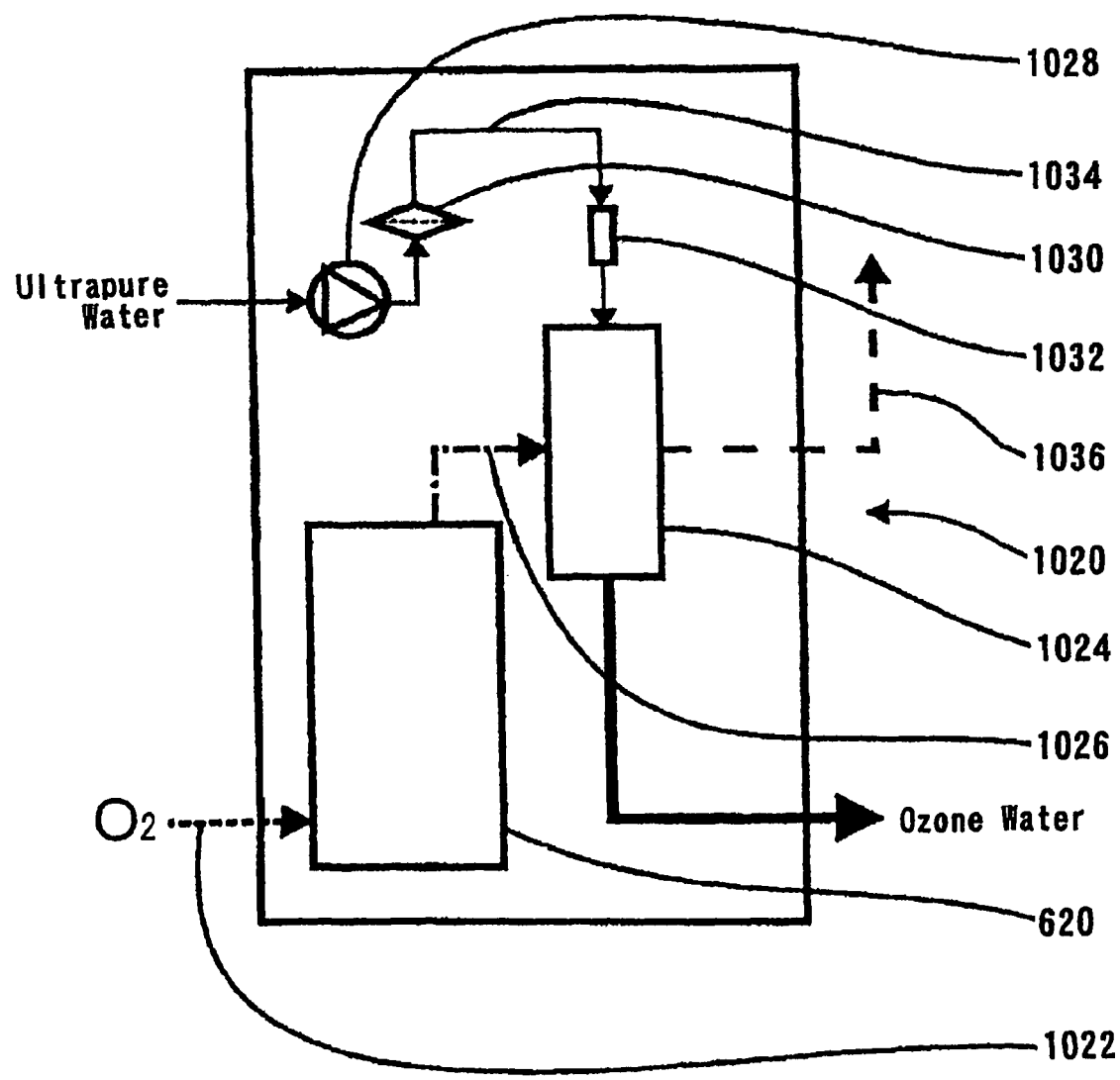
F I G. 24

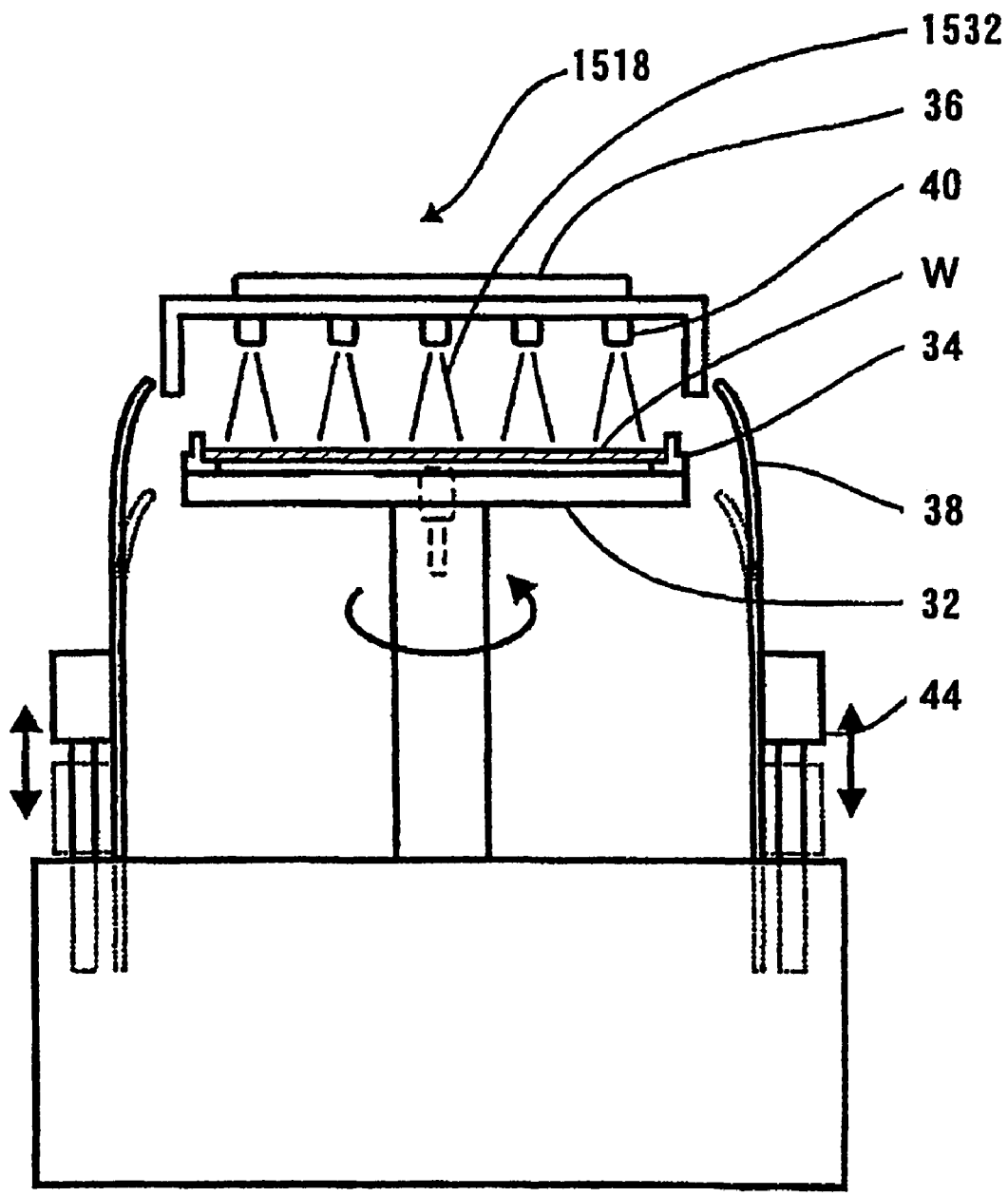
F I G. 3 3

F I G. 3 9
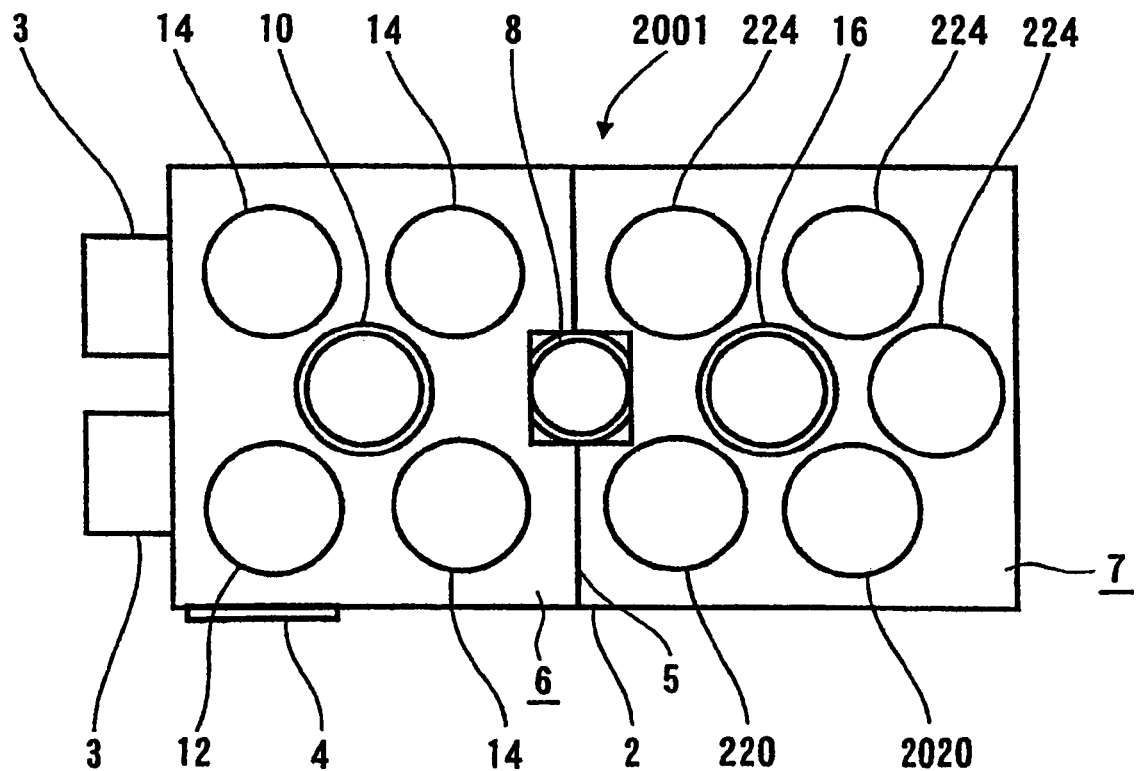

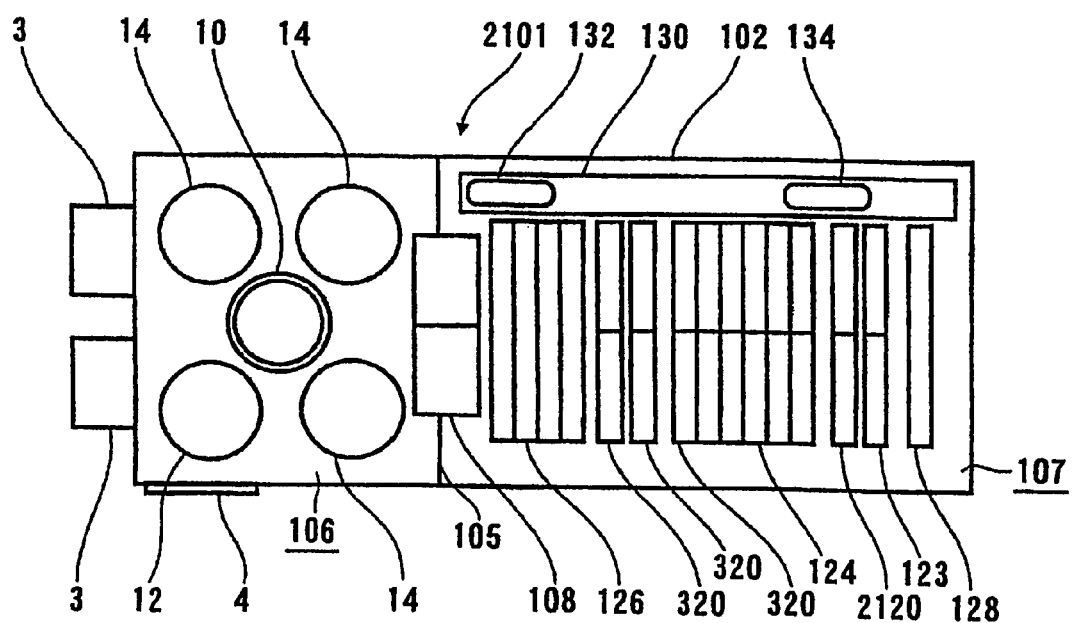
F I G. 4 1

PLATING METHOD AND APPARATUS

This application is a divisional of U.S. application Ser. No. 10/571,751, filed Jan. 22, 2007, now abandoned, which is a national stage application of International application No. PCT/JP2004/014698, filed Sep. 29, 2004.

BACKGROUND OF THE INVENTION

1. Technical Field

The present invention relates to a plating method and apparatus for sequentially performing a plating process on a substrate such as a lead frame, a printed board, a flexible circuit, a tape substrate, or a semiconductor wafer used for electronic devices, and more particularly to a plating method and apparatus used to deposit a metal film on a substrate for large-scale integrated circuits (LSI) or to form interconnections in such a substrate. Further, the present invention relates to a substrate processing method for sequentially performing a wet process, such as a plating process, a coating process, or an etching process, on fine recesses or trenches formed in a substrate.

2. Background Art

Recently, a plating process has been employed to form metal films, organic films, interconnections, or bumps (protruding connecting electrode terminals) for semiconductor circuits in a substrate such as a silicon wafer. For example, it has widely been practiced to form bumps of gold, silver, copper, solder, nickel, or multi-layer materials of these metals at predetermined portions on a surface of a semiconductor wafer, which has semiconductor circuits and fine interconnections between the semiconductor circuits, to electrically connect the interconnections via the bumps with electrodes of a package substrate or with tape automated bonding (TAB) electrodes.

Methods of forming interconnections or bumps include various methods, such as electroplating, electroless plating, vapor deposition, and printing. According to a recent tendency to an increased number of I/O terminals in a semiconductor chip and to finer pitches between interconnections, an electroplating method has been employed more frequently because of its capability of fine processing and a high deposition rate. The electroplating method, which is one of the most popular methods of forming interconnections or bumps, can form a metal film having a high purity at a high deposition rate by a relatively simple control. Meanwhile, an electroless plating method does not need a seed layer on a substrate to supply an electric current. Thus, the electroless plating method requires a smaller number of processes to form interconnections or bumps in the substrate.

When a film is to be formed on a semiconductor substrate, it is strongly desired to improve uniformity of the thickness and the quality of the film and reduce manufacturing cost. Accordingly, various improvements have been developed so far in both of the plating methods.

In order to achieve satisfactory plating without defects, a cleaning process is performed on a surface (to be plated) of a substrate before a plating process in many cases. Such a process to remove dirt or oxides on a surface of a substrate before a plating process is referred to as a pre-plating process. Substrates for LSI or fine circuit boards are generally handled in a clean environment. Nevertheless, their circuit patterns are so fine that serious defects may be caused by slight change in quality of a surface of a substrate or slight attachment of foreign matter to a surface of a substrate. Accordingly, in many cases, a pre-plating process is performed immediately before a plating process.

Further, as one of the methods of forming circuits in substrates for LSI or fine circuit boards, there has widely been employed a method of forming a photopolymer film (resist or photoresist) on a substrate, transferring a circuit pattern or a bump pattern to the resist by a pattern transferring device such as a pattern exposure device, and then plating the substrate to form interconnections or bumps in the substrate. In this case, after a pattern has been transferred to a surface of a resist, a development process is performed to remove the resist at desired portions. Thus, a plating pattern is formed so that an underlying film is exposed at portions at which the resist has been removed. The underlying film has surfaces brought into contact with a plating solution. These surfaces of the underlying film should be clean such that no foreign matter is present thereon.

Generally, photopolymer resists are unlikely to be wet with a plating solution during plating. Specifically, resists have poor wettability. On the contrary, some resists have high water repellency. If a resist has poor wettability, air bubbles are often produced and left in fine patterns in the resist so as to cause plating defects. Specifically, if a resist has poor wettability, plating defects are likely to be caused. Particularly, according to a recent tendency to an increased number of I/O terminals in a semiconductor chip and to finer pitches between interconnections, a pre-plating process has increasingly become important to remove air bubbles in fine patterns of a substrate.

When a plated film is to be formed in fine trenches or plugs for interconnections in a substrate such as a semiconductor wafer or in openings of a resist having poor wettability, a plating solution or a pre-treatment liquid cannot sufficiently enter the trenches, plugs, or openings. Thus, air bubbles are likely to be produced in the plating solution or the pre-treatment liquid and left in the fine trenches, plugs, or openings. Such air bubbles may cause plating defects or plating incompletion.

In order to prevent such plating defects or plating incompletion, it has been proposed to add a surface-active agent to a plating solution so as to lower surface tension of the plating solution to thereby facilitate entry of the plating solution into fine trenches or plugs for interconnections in a substrate or openings of a resist. However, when the surface tension of the plating solution is lowered, air bubbles are likely to be produced in a plating solution during circulation. Further, addition of the surface-active agent to the plating solution may cause abnormal plating deposition or increase the amount of organic matter contained in a plated film. Thus, properties of the plated film may adversely be affected by addition of the surface-active agent to the plating solution.

Accordingly, as described above, it is necessary to remove air bubbles from a surface of a substrate before a plating process so as to achieve satisfactory plating without defects. Substrates for LSI and fine circuit boards are generally handled in a clean environment. Nevertheless, their circuit patterns become so fine that serious defects may be caused by slight attachment of air bubbles to the surface because photopolymer resists are generally hydrophobic. Accordingly, a pre-plating process such as a deaeration process should be performed immediately before a plating process to wet fine trenches or plugs for interconnections in a substrate or openings of a resist sufficiently with a plating solution.

As described above, the surfaces of the underlying film should be clean such that no foreign matter is present thereon. Specifically, since plating defects may be caused by attachment of a resist residue or foreign matter to the surfaces of the underlying film exposed to the outside, it is necessary to perform a process for removing the resist residue or foreign matter, e.g. a descum process.

Generally, for such a descum process, a plasma ashing method has been employed. The plasma ashing method includes reacting a resist residue or organic foreign matter with activated oxygen to convert it into carbon dioxide ($CO_2$), water vapor ($H_2O$), and the like to remove the resist residue or organic foreign matter. The plasma ashing process is a dry process which is performed in a clean vacuum. Accordingly, a plasma ashing device for performing the plasma ashing process is generally located at a different site than a device for performing a chemical liquid process (wet process) such as a plating process.

In general, a plating apparatus includes a plating tank (plating chamber) and a pre-treatment tank (pre-treatment chamber) for performing a pre-plating process using an acid or alkali solution. In the pre-treatment tank of the plating apparatus, a cleaning process or an activation process is performed on a surface of a substrate (surfaces of an underlying film). A substrate for LSI or a fine circuit board is immersed in a pre-plating liquid immediately before a plating process to clean and activate the surface of the substrate. The substrate is cleaned (or rinsed) with pure water to remove the chemical liquid thereon. Then, the substrate is brought into contact with the plating solution to perform a plating process. Thus, the plating apparatus generally includes a pre-plating tank (pre-treatment tank), a rinsing tank, and a plating tank, which are arranged adjacent to each other.

In a plating method for forming interconnections or bumps in a substrate as described above, pre-plating processes are performed. Recently, in order to achieve further integration of semiconductor circuits or high-density packaging, it is desired to improve a conventional film deposition method using plating and provide a plating method without any defects. It is also desired to provide a plating apparatus having high reliability which can achieve such a plating method.

Further, if organic matter or a resist residue is attached to surfaces of an underlying film of the substrate which are exposed at bottoms of the resist pattern, then plating defects are more likely to be caused. Accordingly, there are strongly desired a plating method which can solve these drawbacks and an apparatus which can achieve such a plating method.

SUMMARY OF THE INVENTION

The present invention has been made in view of the above drawbacks. It is, therefore, a first object of the present invention to provide a plating method and apparatus which can achieve reliable and stable plating without plating defects.

A second object of the present invention is to provide a substrate processing method which can achieve reliable and stable deposition in fine or ultra-fine recesses or trenches formed in a surface of a substrate.

According to a first aspect of the present invention, there is provided a plating method which can achieve satisfactory plating without plating defects. In this plating method, an ultraviolet ray is applied to the surface of the substrate before the plating process.

Thus, by applying an ultraviolet ray (UV ray) to the surface of the substrate prior to the plating process, a small amount of organic substance remaining on the surface of the substrate can be removed so as to improve the wettability of the surface of the substrate. Specifically, the ultraviolet ray reacts with oxygen molecules in the air to produce ozone molecules and excited oxygen atoms. The ozone molecules and the excited oxygen atoms collide with the organic substance remaining on the surface of the substrate, and the organic substance is oxidized and decomposed by the ozone molecules and the excited oxygen atoms. Thus, the organic substance is volatilized as $H_2O$ or $CO_2$ and removed from the surface of the substrate. In this manner, the organic substance can completely be removed from the surface of the substrate so as to improve the wettability of the surface of the substrate. When the surface of the substrate is brought into contact with a plating solution, fine air bubbles (micro air voids), which cause plating defects, can be eliminated on the surface of the substrate. Accordingly, it is possible to achieve satisfactory plating.

Even if a surface of a substrate is cleaned thoroughly, it is difficult to maintain conditions in which organic matter is completely prevented from being attached to the surface of the substrate from an atmosphere for a long term. Accordingly, in order to achieve satisfactory plating without plating defects, it is effective to apply an UV ray to the surface of the substrate immediately before the plating process so as to clean the surface of the substrate.

In this case, the surface of the substrate may be brought into contact with an acid liquid after the applying process before the plating process. When the acid liquid is brought into contact with the surface of the substrate, the surface of the substrate is activated. Thus, by activating the surface of the substrate, it is possible to increase adhesion of a plated film to the surface of the substrate. Accordingly, it is possible to achieve satisfactory plating without plating defects.

The ultraviolet ray may be emitted from an UV lamp, a low-pressure mercury lamp, an ArF excimer laser, or an excimer lamp with a dielectric barrier discharge.

According to a second aspect of the present invention, there is provided a plating method which can achieve satisfactory plating without plating defects. In this plating method, a surface of a substrate is exposed to an ozone gas before the plating process.

By exposing the surface of the substrate to the ozone gas prior to the plating process, as with application of an ultraviolet ray to the surface of the substrate, organic substance remaining on the surface of the substrate can be removed so as to improve the wettability of the surface of the substrate.

In this case, the surface of the substrate may be brought into contact with an acid liquid after the applying process before the plating process. The ozone gas may include ozone at a volume fraction of at least 10%.

According to a third aspect of the present invention, there is provided a plating method which can achieve satisfactory plating without plating defects. In this plating method, a surface of a substrate is brought into contact with ozone water before the plating process.

By bringing the surface of the substrate into contact with the ozone water prior to the plating process, as with application of an ultraviolet ray to the surface of the substrate, any organic substance remaining on the surface of the substrate can be removed so as to improve the wettability of the surface of the substrate.

In this case, the surface of the substrate may be brought into contact with an acid liquid after the bringing process with the ozone water before the plating process. An ozone gas may be dissolved in pure water by diffusion and dissolution through an ozone dissolution membrane to generate the ozone water.

According to a fourth aspect of the present invention, there is provided a plating method which can achieve satisfactory plating without plating defects. In this plating method, a surface of a substrate is brought into contact with electrolytic ionized water before the plating process Anodic water (oxidized water) of electrolytic ionized water can remove organic substance, and cathodic water (reduced water) of electrolytic ionized water can remove particles effectively. Accordingly, by bringing the surface of the substrate into contact with the electrolytic ionized water prior to the plating process, it is possible to improve the wettability of the surface of the substrate and effectively remove particles attached to the surface of the substrate so as to clean the surface of the substrate.

In this case, the surface of the substrate may be brought into contact with an acid liquid after the bringing process with the electrolytic ionized water before the plating process. The electrolytic ionized water may comprise anodic water or cathodic water generated by electrolysis of a solution containing pure water or an electrolyte.

According to a fifth aspect of the present invention, there is provided a plating method which can achieve satisfactory plating without plating defects. In this plating method, a surface of a substrate is plated with an acidic plating solution. The surface of the substrate is cleaned with pure water after the plating process. The surface of the substrate is cleaned with an alkalescent aqueous solution after the plating process.

When interconnections or bumps for semiconductor circuits are formed in a silicon wafer or other substrates, copper, nickel, or solder is often used for the interconnections or bumps. In order to form such interconnections or bumps by plating, a strongly acidic plating liquid is used in many cases. After the plating process, the surface of the substrate (plated film) is cleaned with pure water and further cleaned with an alkalescent aqueous solution. Accordingly, acid components, which have not been cleaned with pure water and have remained on the plated surface of the substrate, can be neutralized with the alkalescent aqueous solution to prevent disadvantages such as oxidation of the plated surface and alteration of the plated surface.

The alkalescent aqueous solution may comprise an alkalescent aqueous solution utilizing electrolytic ionized water, a trisodium phosphate solution, a tripotassium phosphate solution, or dilute ammonia water.

According to a sixth aspect of the present invention, there is provided a plating method which can achieve satisfactory plating without plating defects. In this plating method, a steam treatment using steam is performed on a surface of a substrate. The surface of the substrate is brought into contact with a plating solution after the steam treatment so as to form a plated film on the surface of the substrate.

By performing a steam treatment using steam on a surface of a substrate prior to the plating process, the wettability of the surface of the substrate can be improved. Specifically, such a steam treatment can activate a resist or the like on the surface (to be plated) of the substrate to increase $OH^-$ of a hydrophilic group on the surface of the substrate. Thus, the wettability of the surface of the substrate can be improved. Thus, it is possible to achieve reliable and stable plating without plating defects.

In this case, the surface of the substrate may be brought into contact with an acid liquid after the steam treatment before the plating process. It is desirable to generate the steam from pure water or pure water to which a surface-active agent is added.

It is desirable that the substrate has an organic resist film with a predetermined pattern formed in the organic resist film. When an ultraviolet ray is applied to a surface of the organic resist film, molecular bindings of molecules of the surface of the resist film are cut so as to bond a hydrophilic group such as a COOH group or an OH group to side chains of the molecules. Accordingly, the wettability of the surface of the resist film can be improved. Similarly, resist residue or organic substance remaining on exposed surfaces of an underlying film at the bottom of the resist pattern can be oxidized, decomposed, volatilized as $H_2O$ or $CO_2$, and removed from the exposed surfaces of the underlying film. Accordingly, the wettability can be improved on the exposed surfaces of the underlying film at the bottom of the resist pattern.

In this manner, the wettability can be improved on the surfaces of the resist film and on the exposed surfaces of the underlying film at the bottoms of the resist pattern. Therefore, even if a resist film is formed in a substrate, and a pattern is formed in the resist film by an exposure device, it is possible to achieve satisfactory plating without plating defects to form interconnections or bumps in the substrate.

In addition to a case where an ultraviolet ray is applied to the surface of the substrate, the aforementioned effect also holds true when a surface of a substrate is exposed to an ozone gas or brought into contact with ozone water or electrolytic ionized water.

According to a seventh aspect of the present invention, there is provided a substrate processing method which can achieve reliable and stable deposition in fine or ultra-fine recesses or trenches formed in a surface of a substrate. In this substrate processing method, a steam treatment using steam is performed on a surface of a substrate, and then a wet process is performed on the surface of the substrate to deposit a film in fine or ultra-fine recesses or trenches formed in the surface of the substrate.

By performing a steam treatment using steam on a surface of a substrate prior to the wet process, the wettability of the surface of the substrate can be improved. Specifically, steam molecular motion (or water molecular motion) allows steam to instantaneously be introduced into fine recesses or trenches formed in a substrate, which have a width of at least several nanometers. Accordingly, a liquid film can be formed on surfaces of the fine recesses or trenches so as to have at least a monomolecular layer. The substrate becomes hydrophilic by the formation of the liquid film. Thus, in the subsequent wet process, a treatment liquid can be brought into contact with the substrate at a reduced contact angle so as to prevent formation of air bubbles.

According to an eighth aspect of the present invention, there is provided a plating apparatus having an ultraviolet ray radiation chamber configured to apply an ultraviolet ray to a surface of a substrate, and a plating chamber configured to plate the surface of the substrate to which the ultraviolet ray is applied. The plating apparatus includes a frame housing at least the ultraviolet ray radiation chamber and the plating chamber.

The plating apparatus may have an acid treatment chamber configured to bring the surface of the substrate to which the ultraviolet ray is applied into contact with an acid liquid. The acid treatment chamber is housed by the frame.

The ultraviolet ray radiation chamber may comprise an UV lamp, a low-pressure mercury lamp, an ArF excimer laser, or an excimer lamp with a dielectric barrier discharge.

According to a ninth aspect of the present invention, there is provided a plating apparatus having an ozone gas exposure chamber configured to expose a surface of a substrate to an ozone gas, and a plating chamber configured to plate the surface of the substrate exposed to the ozone gas. The plating apparatus includes a frame housing at least the ozone gas exposure chamber and the plating chamber.

The plating apparatus may have an acid treatment chamber configured to bring the surface of the substrate exposed to the ozone gas into contact with an acid liquid. The acid treatment chamber is housed by the frame. It is desirable that the ozone gas includes ozone at a volume fraction of at least 10%.

According to a tenth aspect of the present invention, there is provided a plating apparatus having an ozone water process chamber configured to bring a surface of a substrate into contact with ozone water, and a plating chamber configured to plate the surface of the substrate brought into contact with the ozone water. The plating apparatus includes a frame housing at least the ozone water process chamber and the plating chamber.

The plating apparatus may have an acid treatment chamber configured to bring the surface of the substrate, brought into contact with the ozone water, into contact with an acid liquid. The acid treatment chamber is housed by the frame.

The plating apparatus may include an ozone water generator configured to dissolve an ozone gas in pure water by diffusion and dissolution through an ozone dissolution membrane to generate the ozone water.

According to an eleventh aspect of the present invention, there is provided a plating apparatus having an electrolytic ionized water process chamber configured to bring a surface of a substrate into contact with electrolytic ionized water, and a plating chamber configured to plate the surface of the substrate brought into contact with the electrolytic ionized water. The plating apparatus includes a frame housing at least the electrolytic ionized water process chamber and the plating chamber.

The plating apparatus may have an acid treatment chamber configured to bring the surface of the substrate, brought into contact with the electrolytic ionized water, into contact with an acid liquid. The acid treatment chamber is housed by the frame.

The plating apparatus may include an electrolytic ionized water generator configured to generate anodic water or cathodic water as the electrolytic ionized water by electrolysis of a solution containing pure water or an electrolyte.

According to a twelfth aspect of the present invention, there is provided a plating apparatus having a plating chamber configured to plate a surface of a substrate with an acidic plating solution, and a first cleaning chamber configured to clean the plated surface of the substrate with pure water. The plating apparatus includes a second cleaning chamber configured to clean the plated surface of the substrate with an alkalescent aqueous solution, and a frame housing at least the plating chamber, the first cleaning chamber, and the second cleaning chamber.

The alkalescent aqueous solution may comprise an alkalescent aqueous solution utilizing electrolytic ionized water, a trisodium phosphate solution, a tripotassium phosphate solution, or dilute ammonia water.

According to a thirteenth aspect of the present invention, there is provided a plating apparatus having a steam treatment chamber configured to perform a steam treatment using steam on a surface of a substrate, and a plating chamber configured to plate the surface of the substrate subjected to the steam treatment. The plating apparatus includes a frame housing at least the steam treatment chamber and the plating chamber.

The steam may be generated from pure water or pure water to which a surface-active agent is added.

The plating apparatus may have an acid treatment chamber configured to bring the surface of the substrate subjected to the steam treatment into contact with an acid liquid. The acid treatment chamber is housed by the frame.

It is desirable that the plating chamber is configured to electroplate the surface of the substrate. In this case, the plating chamber may have a plating tank holding a plating solution, an anode disposed so as to face the substrate, and a power source configured to apply a voltage between the substrate and the anode.

The plating apparatus may include a transfer device operable to transfer the substrate, the transfer device being disposed in the frame, and a loading/unloading chamber configured to load the substrate into the frame and unload the substrate from the frame. In this case, the transfer device may be configured to hold and transfer the substrate in a horizontal state within the frame.

The plating apparatus may include a dry station area defined in the frame and a wet station area defined in the frame. The wet station area includes at least the plating chamber. The plating apparatus may also include a first transfer device operable to hold and transfer the substrate in a horizontal state within the dry station area. The plating apparatus may also have a second transfer device operable to hold and transfer the substrate in a vertical state within the wet station area. In this case, a partition wall may be provided to separate the frame into the dry station area and the wet station area.

The substrate may be held by a substrate holder and transferred together with the substrate holder within the wet station area.

The above and other objects, features, and advantages of the present invention will be apparent from the following description when taken in conjunction with the accompanying drawings which illustrate preferred embodiments of the present invention by way of example.

BRIEF DESCRIPTION OF DRAWINGS

FIG. 2 is a schematic view showing a steam treatment chamber in the plating apparatus shown in FIG. 1;

FIG. 7 is a schematic view showing a steam treatment chamber in the plating apparatus shown in FIG. 5;

FIG. 24 is a schematic view showing an ozone water generator in the plating apparatus shown in FIG. 23;

FIG. 33 is a schematic view showing an electrolytic ionized water process chamber in the plating apparatus shown in FIG. 31;

FIG. 39 is a plan view showing a plating apparatus according to a twenty-first embodiment of the present invention;

FIG. 41 is a plan view showing a plating apparatus according to a twenty-second embodiment of the present invention.

DETAILED DESCRIPTION OF THE INVENTION

Figure 1:
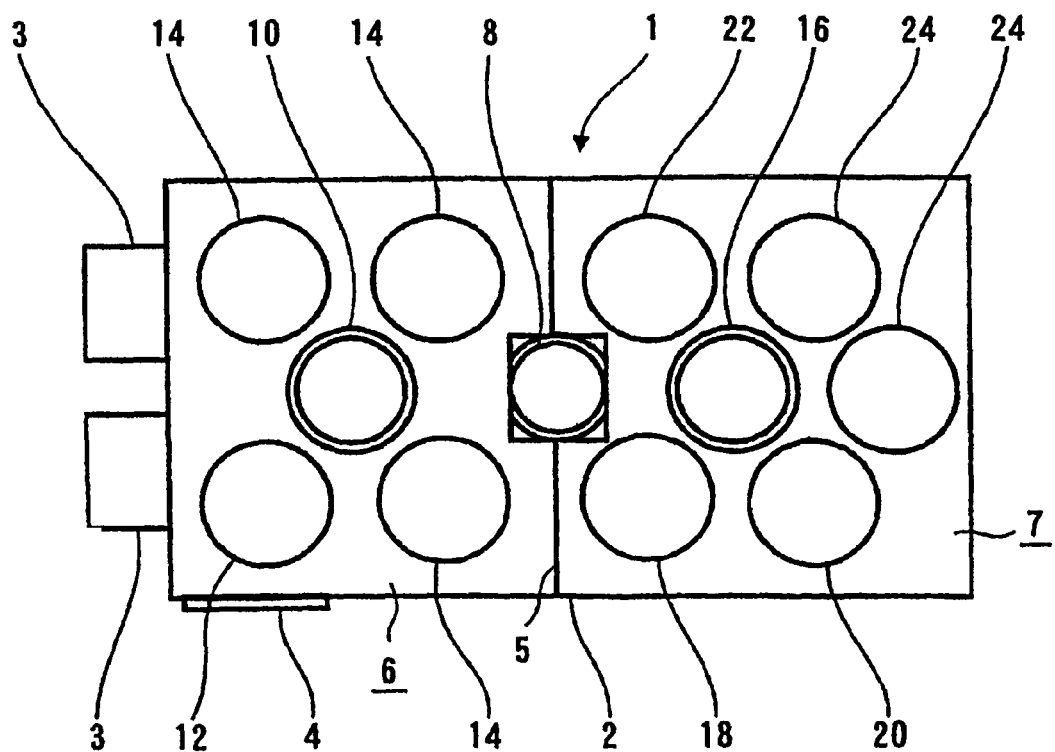
FIG. 1 is a plan view showing a plating apparatus according to a first embodiment of the present invention.

A plating apparatus according to embodiments of the present invention will be described below with reference to FIGS. 1 through 42. Like or corresponding parts are denoted by like or corresponding reference numerals throughout drawings, and will not be described below repetitively.

FIG. 1 illustrates a plating apparatus 1 according to a first embodiment of the present invention. The plating apparatus 1 is designed to hold and process a substrate (not shown) such as a semiconductor wafer in a horizontal state in respective chambers. As shown in FIG. 1, the plating apparatus 1 has a rectangular frame 2 and two loading/unloading chambers 3 connected to the frame 2. Each of the loading/unloading chambers 3 is configured to receive a substrate cassette (not shown) which accommodates a number of substrates. The frame 2 has a control panel 4 attached to a side wall of the frame 2. The control panel 4 is used to operate the plating apparatus 1 by an operator.

The interior of the frame 2 is separated into a dry station area 6 and a wet station area 7 by a partition wall 5. The plating apparatus 1 includes a temporary placement stage 8 located between the dry station area 6 and the wet station area 7. The temporary placement stage 8 is used to transfer a substrate between the dry station area 6 and the wet station area 7.

The dry station area 6 includes therein a first transfer robot 10 for horizontally holding a substrate and transferring the substrate within the dry station area 6, an aligner 12 for detecting orientation of the substrate and aligning the substrate in a predetermined direction prior to a plating process, and three cleaning and drying chambers 14 for cleaning and drying the substrate. The wet station area 7 includes therein a second transfer robot 16 for horizontally holding the substrate and transferring the substrate within the wet station area 7, a steam treatment chamber 18 for performing a steam treatment on a surface (to be plated) of the substrate, an acid treatment chamber 20 for performing an acid treatment on the surface of the substrate, a cleaning chamber 22 for cleaning the substrate, and two plating chambers 24 for plating the surface of the substrate.

FIG. 2 illustrates an example of the steam treatment chamber 18 in the wet station area 7. The steam treatment chamber 18 is configured to perform a steam treatment on a surface (to be plated) of a substrate W with steam to improve the wettability of the substrate W. As shown in FIG. 2, the steam treatment chamber 18 includes a cell 28 holding pure water 26 therein and a heater 30 for heating the pure water 26 to generate steam. Steam may be generated from pure water or pure water to which a surface-active agent is added. Such a steam treatment is effective in a case where an organic resist film is applied to a surface (to be plated) of the substrate W and a pattern for interconnections or bumps is formed in the resist film. For example, the steam treatment is performed at a temperature of 30 to 100° C., preferably 50 to 70° C., for a period of several seconds to 10 minutes, preferably 0.3 minute to 1 minute.

Specifically, such a steam treatment can activate a resist or an under bump metal (UBM) on the surface (to be plated) of the substrate to increase $OH^-$ of a hydrophilic group on the surface of the substrate. Thus, the wettability of the surface of the substrate can be improved. Specifically, the steam treatment can instantaneously form a water film on the surface of the resist or UBM without any air bubbles remaining on the surface of the resist or UBM. When a plating process is performed after such a water film has been formed, a plating solution can be brought into contact with the resist or UBM at a reduced contact angle. Accordingly, the wettability of the resist or UBM with the plating solution is remarkably improved even in a fine pattern. Thus, it is possible to achieve satisfactory plating without plating defects.

Such a steam treatment can be performed not only as a pre-treatment process prior to a plating process, but also as a pre-treatment process prior to various wet processes. When a steam treatment is performed on a surface of a substrate prior to a wet process, the wettability of the surface of the substrate can be improved. Specifically, steam molecular motion (or water molecular motion) allows steam to instantaneously be introduced into fine recesses or trenches formed in a substrate, which have a width of at least several nanometers. Accordingly, a liquid film can be formed on surfaces of the fine recesses or trenches so as to have at least a monomolecular layer. The substrate becomes hydrophilic by the formation of the liquid film. Thus, in a subsequent wet process, a treatment liquid can be brought into contact with the substrate at a reduced contact angle so as to prevent formation of air bubbles.

Figure 3:
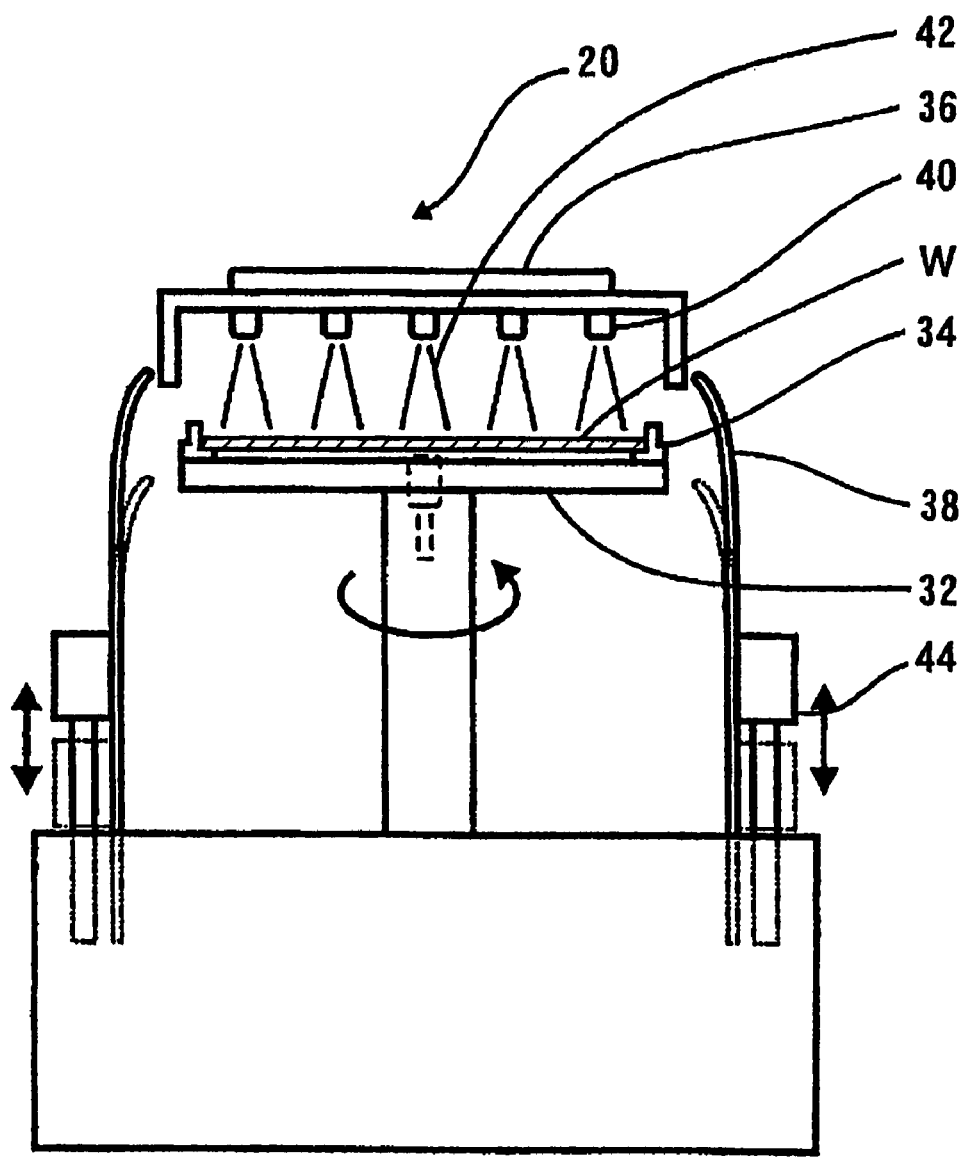
FIG. 3 is a schematic view showing an acid treatment chamber in the plating apparatus shown in FIG. 1.

FIG. 3 illustrates an example of the acid treatment chamber 20 in the wet station area 7. As shown in FIG. 3, the acid treatment chamber 20 includes a rotatable stage 32, a substrate chucking mechanism 34 attached to an upper surface of the rotatable stage 32, a spray nozzle 36 disposed above the rotatable stage 32, and a side wall 38 surrounding the rotatable stage 32 and the spray nozzle 36. The substrate chucking mechanism 34 is configured to clamp a peripheral portion of a substrate W and horizontally hold the substrate W in a state such that a surface (to be plated) of the substrate W faces upward. When the rotatable stage 32 is rotated, the substrate W held by the substrate chucking mechanism 34 is rotated together with the rotatable stage 32. The spray nozzle 36 has a number of spray heads 40 for spraying an acid liquid 42 onto the surface of the substrate W. The side wall 38 is configured to be vertically movable by sliders 44. The acid liquid 42 is selected in consideration of a post-treatment liquid. For example, the acid liquid 42 may be dilute sulfuric acid or methansulfonic acid having a concentration of 0 to 20%, preferably 5 to 10%. The acid treatment chamber 20 may be eliminated.

With the acid treatment chamber 20 having the above arrangement, the substrate W is held and rotated by the substrate chucking mechanism 34. The acid liquid 42 is sprayed to the surface (to be plated) of the substrate W from the spray heads 40. The acid liquid 42 can be brought into contact with the surface of the substrate W to activate the surface of the substrate W. Thus, by activating an underlying film and plating the activated underlying film, it is possible to increase adhesion of a plated film to the underlying film (the surface of the substrate W). Accordingly, it is possible to achieve satisfactory plating more effectively without plating defects.

Figure 4:
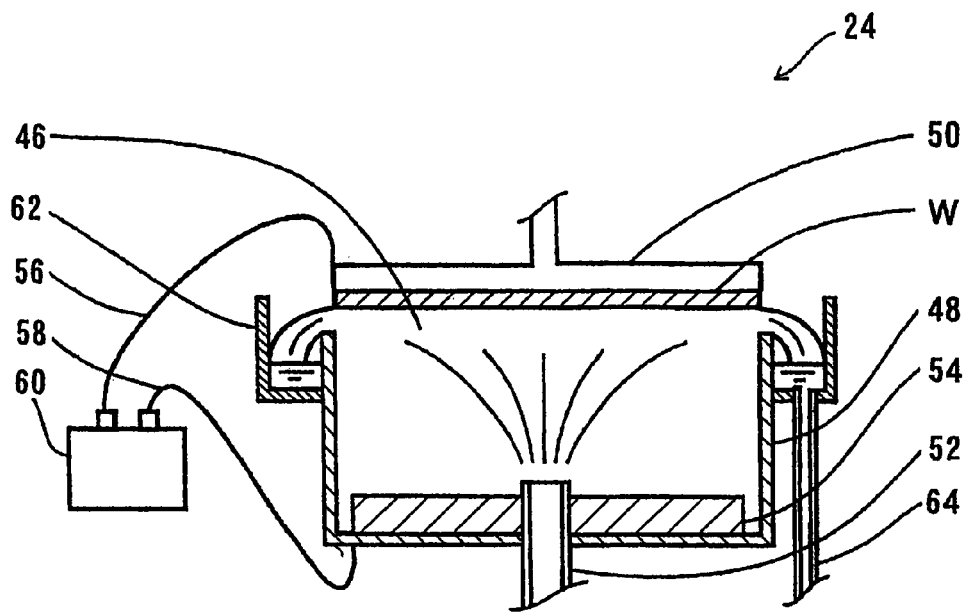
FIG. 4 is a schematic view showing a plating chamber in the plating apparatus shown in FIG. 1.

FIG. 4 illustrates an example of the plating chamber 24 in the wet station area 7. As shown in FIG. 4, the plating chamber 24 includes a plating tank 48 holding a plating solution 46, a substrate head 50 for horizontally holding a substrate W in a state such that a surface (to be plated) of the substrate W faces downward, a nozzle 52 provided at a bottom of the plating tank 48, an anode 54 disposed horizontally at the bottom of the plating tank 48, and a power source 60 connected to the substrate W and the anode 54 via electric conductors 56 and 58, respectively.

The plating solution 46 is supplied from the nozzle 52 into the interior of the plating tank 48 so as to bring the surface of the substrate W held by the substrate head 50 into contact with the plating solution 46. The plating solution 46 supplied from the nozzle 52 flows in an outward direction along the surface of the substrate W and overflows the plating tank 48 into an overflow tank 62 provided outside of the plating tank 48. The plating solution 46 flowing into the overflow tank 62 is discharged through a plating solution discharge outlet 64, circulated by a circulating pump (not shown), and supplied from the nozzle 52. The plating chamber 24 may include a temperature regulator for regulating the temperature of the plating solution 46 or a filter for removing suspended particles of dust in the plating solution 46.

In the present embodiment, the substrate W is connected to a cathode of the power source 60, whereas the anode 54 is connected to an anode of the power source 60. In this state, the plating solution 46 is brought into contact with the surface of the substrate W so as to deposit a metal on the surface of the substrate W. Thus, a metal film is formed on the surface of the substrate W. A soluble anode plate is generally used as the anode 54. Such an anode is reduced in thickness according to progress of the plating process when it supplies metal ions to the surface of the substrate W.

With the plating apparatus 1 having the above arrangement, the first transfer robot 10 takes a substrate out of a substrate cassette loaded on one of the loading/unloading chambers 3 and transfers the substrate to the aligner 12. In the aligner 12, an orientation flat or a notch formed in the substrate is aligned in a predetermined direction so as to position the substrate in place. Then, the first transfer robot 10 takes the substrate out of the aligner 12 and transfers the substrate to the temporary placement stage 8, which is disposed between the dry station area 6 and the wet station area 7.

The substrate placed on the temporary placement stage 8 is transferred to the steam treatment chamber 18 by the second transfer robot 16 in the wet station area 7. In the steam treatment chamber 18, as described above, a steam treatment is performed on a surface (to be plated) of the substrate. Then, the substrate is transferred to the acid treatment chamber 20 by the second transfer robot 16. In the acid treatment chamber 20, the surface of the substrate is processed and activated with an acid liquid. The substrate which has been subjected to the acid treatment is transferred to the cleaning chamber 22, where the surface of the substrate is cleaned. Then, the substrate is transferred to the plating chamber 24, where a plating process is performed on the surface of the substrate. After completion of the plating process, the substrate is placed on the temporary placement stage 8 by the second transfer robot 16.

Then, the substrate placed on the temporary placement stage 8 is transferred to the cleaning and drying chamber 14 by the first transfer robot 10 in the dry station area 6. In the cleaning and drying chamber 14, the substrate is cleaned and dried. Thereafter, the substrate is returned to the substrate cassette in the loading/unloading chamber 3. Thus, according to the plating apparatus 1 in the present embodiment, a plated film (metal film) can automatically be formed on the surface of the substrate.

In the present embodiment, as described above, a steam treatment is performed on the surface of the substrate in the steam treatment chamber 18, and then a plating process is performed in the plating chamber 24. Accordingly, when the substrate is brought into contact with the plating solution 46 in the plating tank 48, fine air bubbles (micro air voids), which would cause plating defects, are not produced on the surface of the substrate. Thus, it is possible to achieve satisfactory plating without plating defects. The activation of the surface of the substrate by the steam treatment immediately before the plating process is effective in satisfactorily plating without plating defects.

Figure 5:
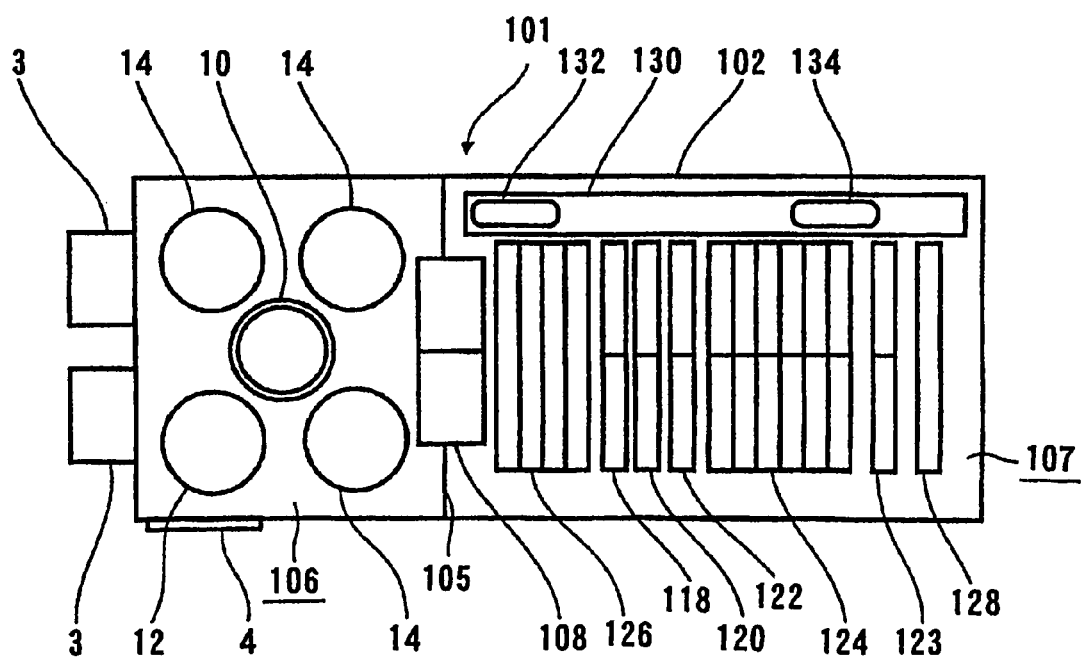
FIG. 5 is a plan view showing a plating apparatus according to a second embodiment of the present invention.

FIG. 5 illustrates a plating apparatus 101 according to a second embodiment of the present invention. The plating apparatus 101 is designed to hold and process a substrate (not shown) such as a semiconductor wafer in a horizontal state during a loading process of a substrate from a substrate cassette (not shown), several processes after the loading process, an unloading process of the substrate to the substrate cassette, and several processes before the unloading process, and to hold and process the substrate in a vertical state during several processes including a plating process. As shown in FIG. 5, the plating apparatus 101 has a rectangular frame 102 with a control panel 4 attached thereto. The interior of the frame 102 is separated into a dry station area 106 and a wet station area 107 by a partition wall 105. The plating apparatus 101 includes two substrate loading stages 108 located adjacent to each other between the dry station area 106 and the wet station area 107. Each of the substrate loading stages 108 is configured to load a substrate into a substrate holder and unload the substrate from the substrate holder. As with the first embodiment, the dry station area 106 includes therein a first transfer robot 10 for horizontally holding a substrate and transferring the substrate within the dry station area 106.

The wet station area 107 includes therein a steam treatment chamber 118 for performing a steam treatment on a surface (to be plated) of the substrate, an acid treatment chamber 120 for processing the surface of the substrate with an acid liquid, two cleaning chambers 122 and 123 for cleaning the substrate, a plating chamber 124 for plating the surface of the substrate, a stocker 126 for storing and temporarily holding substrate holders, and a blowing chamber 128 for drying the substrate.

As shown in FIG. 5, the wet station area 107 includes a transferring rail 130 disposed therein, a second transfer robot 132 provided on the transferring rail 130, and a third transfer robot 134 provided on the transferring rail 130. Thus, each of the second transfer robot 132 and the third transfer robot 134 is movable along the transferring rail 130. Each of the second transfer robot 132 and the third transfer robot 134 is operable to transfer substrate holders each having a substrate loaded thereon between the substrate loading stages 108, the stocker 126, the steam treatment chamber 118, the acid treatment chamber 120, the cleaning chamber 122, the plating chamber 124, the cleaning chamber 123, and the blowing chamber 128. In this case, the substrates are held in a vertical state within the wet station area 107 while they are transferred by the second transfer robot 132 and the third transfer robot 134.

Figure 6:
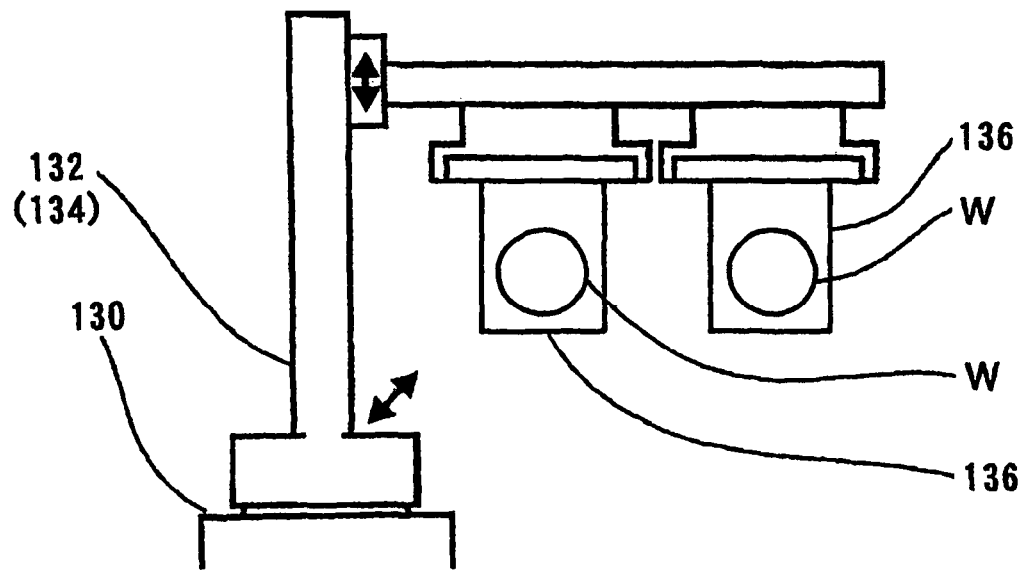
FIG. 6 is a schematic view showing substrate holders in the plating apparatus shown in FIG. 5.

FIG. 6 illustrates substrate holders 136 in the wet station area 107. Each of the second transfer robot 132 and the third transfer robot 134 is operable to change the position of the substrate holders 136, which have substrates W loaded thereon, from a horizontal position on the substrate loading stages 108 into a vertical position. Thus, in the respective process chambers 118, 120, 122, 123, 124, and 128 in the wet station area 107, substrates are processed in a state such that the substrate holders 136 are held in the vertical position by the second transfer robot 132 and the third transfer robot 134.

FIG. 7 illustrates an example of the steam treatment chamber 118 in the wet station area 107. As with the steam treatment chamber 18 in the first embodiment, the steam treatment chamber 118 is configured to perform a steam treatment on surfaces (to be plated) of substrates W with steam to improve the wettability of the substrates W. As shown in FIG. 7, the steam treatment chamber 118 includes a cell 138 holding pure water 26 therein and a heater 140 for heating the pure water 26 to generate steam. The substrates W held in a vertical position by the substrate holders 136 are introduced into the cell 138, and a steam treatment is performed on surfaces of the substrates W.

Figure 8:
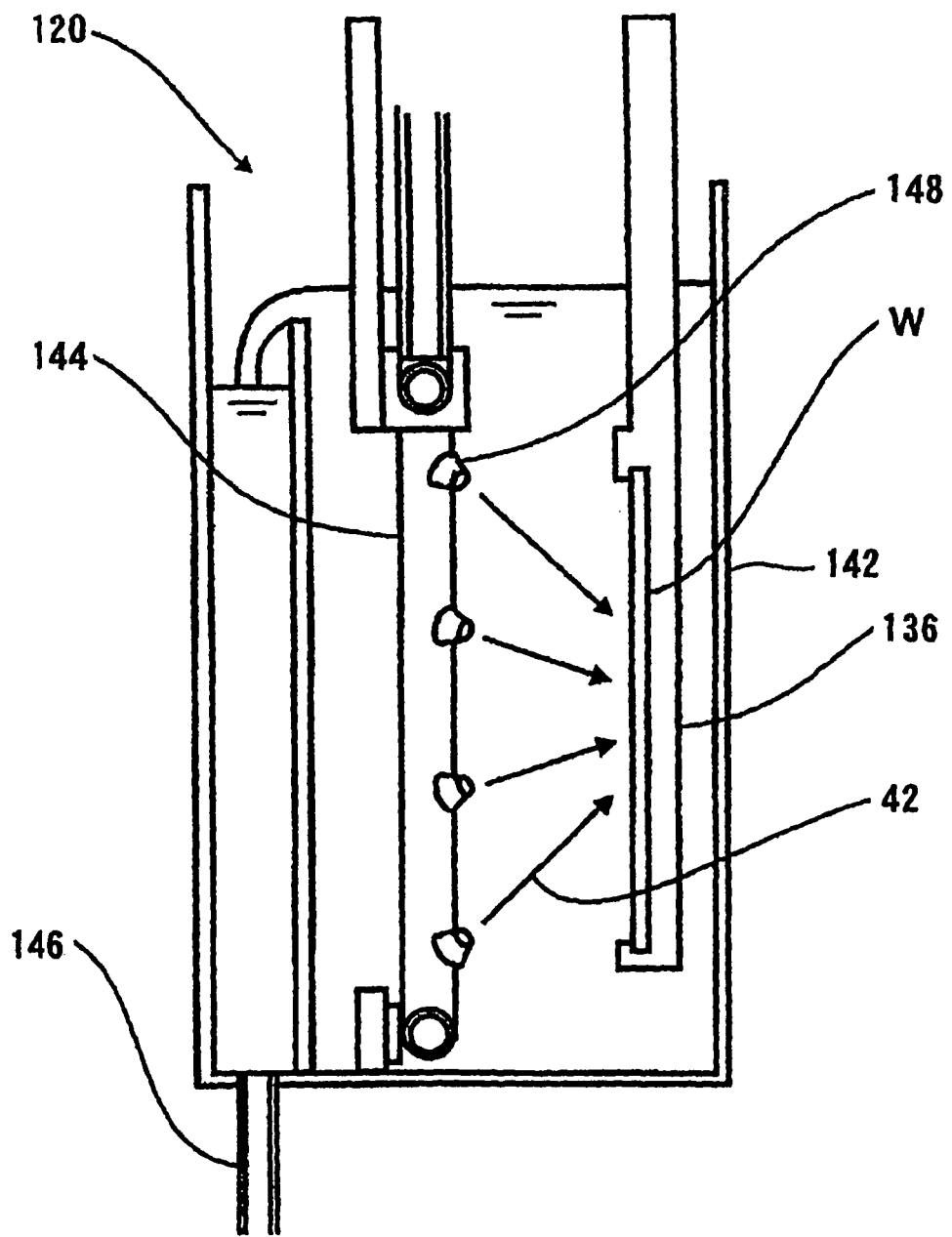
FIG. 8 is a schematic view showing an acid treatment chamber in the plating apparatus shown in FIG. 5.

FIG. 8 illustrates an example of the acid treatment chamber 120 in the wet station area 107. As shown in FIG. 8, the acid treatment chamber 120 includes an acid treatment tank 142 receiving an acid liquid therein, a liquid supply pipe 144 immersed in the acid treatment tank 142, and a liquid discharge pipe 146 connected to a bottom of the acid treatment tank 142. The liquid supply pipe 144 has a plurality of ejection nozzles 148. The ejection nozzles 148 are arranged so as to face the substrates W held in the vertical position by the substrate holders 136 in the acid treatment tank 142. The ejection nozzles 148 eject an acid liquid 42 to the substrates W held by the substrate holders 136. The acid liquid 42 ejected to the substrates W is collected at the bottom of the acid treatment tank 142 and discharged through the liquid discharge pipe 146 to the outside.

Figure 9:
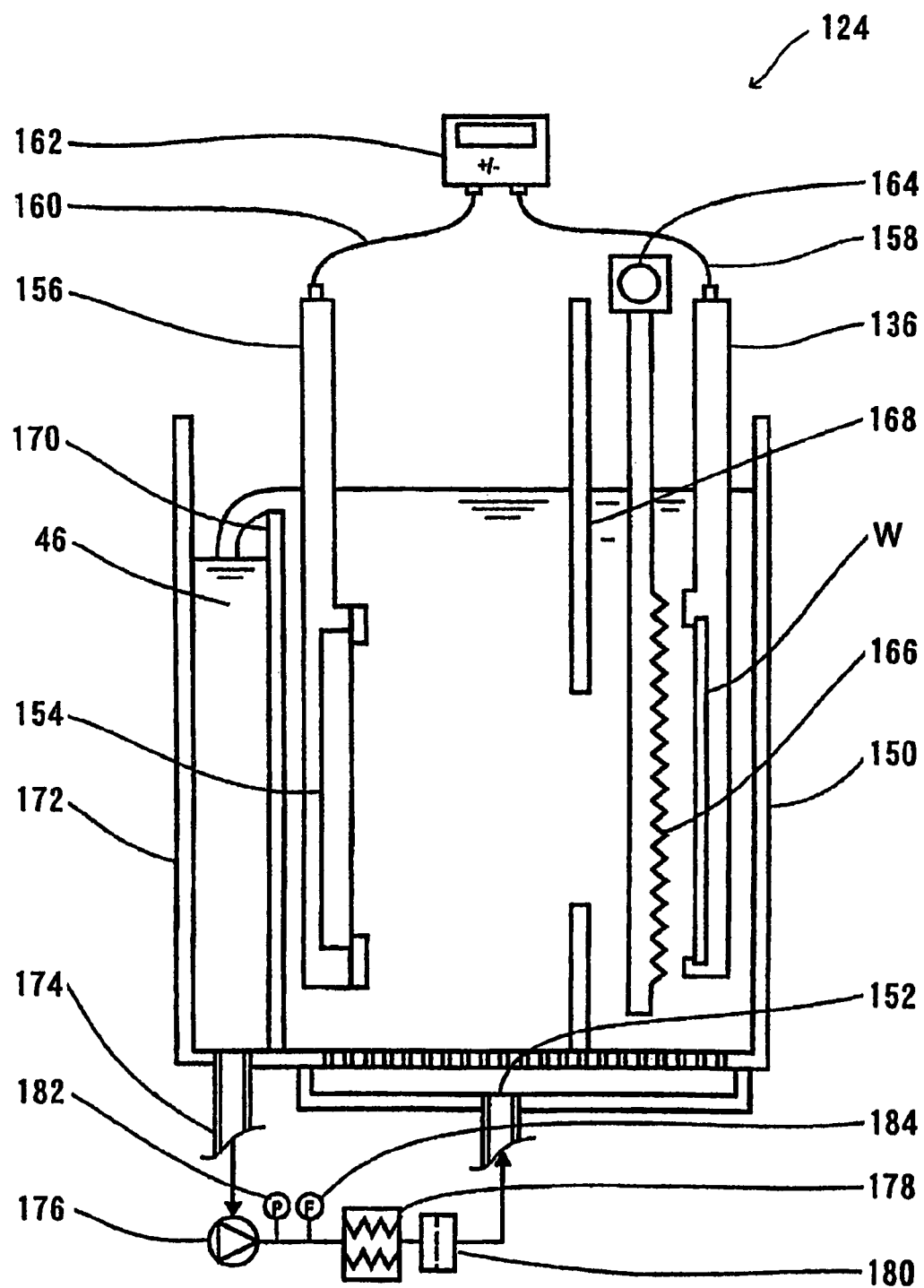
FIG. 9 is a schematic view showing a plating chamber in the plating apparatus shown in FIG. 5.

FIG. 9 illustrates the plating chamber 124 in the wet station area 107. As shown in FIG. 9, the plating chamber 124 includes a plating tank 150 holding a plating solution 46 therein, a nozzle 152 provided at a bottom of the plating tank 150, an anode holder 156 holding an anode 154, and a power source 162 connected to the substrates W and the anode 154 via the electric conductors 158 and 160, respectively. The substrates W held by the substrate holders 136 and the anode 154 held by the anode holder 156 are vertically positioned in parallel to each other so that the surfaces (to be plated) of the substrates W face a surface of the anode 154 and are immersed in the plating solution 46 of the plating chamber 124.

The plating chamber 124 includes a paddle shaft 164, a stirring paddle 166 extending vertically from the paddle shaft 164, and a regulation plate 168 having a central hole formed therein. The stirring paddle 166 and the regulation plate 168 are disposed between the substrates W held by the substrate holders 136 and the anode 154 held by the anode holder 156. The stirring paddle 166 is operable to move in parallel to the substrates W according to movement of the paddle shaft 164 so as to stir the plating solution 46.

The plating solution 46 is supplied from the nozzle 152 into the interior of the plating tank 150 so as to bring surfaces of the substrates W held by the substrate holders 136 into contact with the plating solution 46. The plating solution 46 supplied from the nozzle 152 overflows an overflow weir 170 into an overflow tank 172 provided outside of the plating tank 150. The plating solution 46 flowing into the overflow tank 172 is discharged through a plating solution discharge outlet 174 and circulated by a circulating pump 176. The plating solution 46 passes through a thermostat 178 and a filter 180. Then, the plating solution 46 is supplied from the nozzle 152 into the interior of the plating tank 150. The plating chamber 124 includes a pressure gauge 182 and a flowmeter 184 provided in a circulation passage of the plating solution 46.

In the present embodiment, the substrates W are connected to a cathode of the power source 162, whereas the anode 154 is connected to an anode of the power source 162. Thus, a potential difference is produced between the substrates W and the anode 154. Metal ions in the plating solution 46 receive electrons from the surfaces (to be plated) of the substrates W so as to deposit a metal on the surfaces of the substrates W. Thus, a metal film is formed on the surfaces of the substrates W. The anode 154 emits electrons by the potential difference so that the anode is ionized and dissolved in the plating solution 46. Thus, the anode 154 is reduced in thickness according to the dissolution.

With the plating apparatus 101 having the above arrangement, the first transfer robot 10 takes a substrate out of a substrate cassette loaded on one of the loading/unloading chambers 3 and transfers the substrate to the aligner 12. In the aligner 12, an orientation flat or a notch formed in the substrate is aligned in a predetermined direction so as to position the substrate in place. Then, the first transfer robot 10 takes the substrate out of the aligner 12 and transfers the substrate to the substrate loading stage 108. At the substrate loading stages 108, substrates are loaded into the substrate holders 136 (see FIG. 6).

The substrate holders 136 having substrates loaded thereon are transferred to the stocker 126 by the second transfer robot 132 in the wet station area 107 and stocked in a vertical position in the stocker 126. Then, the substrate holders 136 in the stocker 126 are transferred to the steam treatment chamber 118 by the third transfer robot 134. In the steam treatment chamber 118, as described above, a steam treatment is performed on surfaces (to be plated) of the substrates. Then, the substrates are transferred to the acid treatment chamber 120 by the third transfer robot 134. In the acid treatment chamber 120, the surfaces of the substrates are processed and activated with an acid liquid. The substrates which have been subjected to the acid treatment are transferred to the cleaning chamber 122 by the third transfer robot 134. In the cleaning chamber 122, the surfaces of the substrates are cleaned. Thus, a pre-treatment process of the substrates is completed.

The substrates which have been subjected to the pre-treatment process are transferred to the plating chamber 124 by the third transfer robot 134. In the plating chamber 124, a deposition process is performed by using plating. Then, the substrates are transferred through the cleaning chamber 123 and the blowing chamber 128 to the stocker 126 by the third transfer robot 134 and stocked in a vertical position in the stocker 126. Thereafter, the substrate holders 136 in the stocker 126 are transferred to the substrate loading stages 108 by the second transfer robot 132. At the substrate loading stages 108, the substrates are unloaded from the substrate holders 136. Each of the substrates is transferred to the cleaning and drying chamber 14 by the first transfer robot 10 in the dry station area 106. In the cleaning and drying chamber 14, the substrates are cleaned and dried. Thereafter, the substrates are returned to the substrate cassette in the loading/unloading chamber 3. Thus, according to the plating apparatus 101 in the present embodiment, a plated film (metal film) can automatically be formed on the surface of the substrate.

Figure 10:
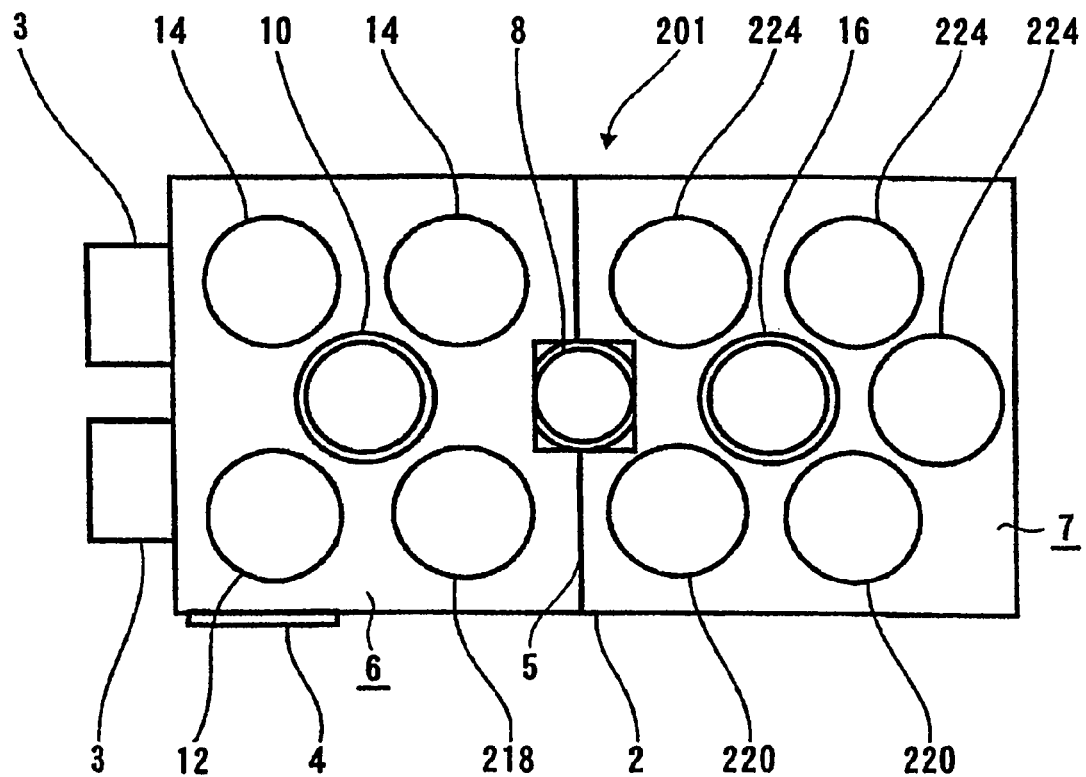
FIG. 10 is a plan view showing a plating apparatus according to a third embodiment of the present invention.

FIG. 10 illustrates a plating apparatus 201 according to a third embodiment of the present invention. The plating apparatus 201 has an ultraviolet ray radiation chamber 218 instead of one of the three cleaning and drying chambers 14 disposed in the dry station area 6 of the plating apparatus 1 in the first embodiment shown in FIG. 1. Further, the wet station area 7 includes therein two rinsing chambers 220 for performing a pre-treatment process (rinsing process) on a surface (to be plated) of a substrate, and three plating chambers 224 for performing a plating process and a rough cleaning process on the surface of the substrate. In the present embodiment, each of the plating chambers 224 serves not only as a plating chamber, but also as a rough cleaning chamber for roughly cleaning the surface of the substrate. Each of the plating chambers 224 has the same structure as the plating chamber 24 in the first embodiment (see FIG. 4).

With the plating apparatus 201 having the above arrangement, the first transfer robot 10 takes a substrate out of a substrate cassette loaded on one of the loading/unloading chambers 3 and transfers the substrate to the aligner 12. In the aligner 12, an orientation flat or a notch formed in the substrate is aligned in a predetermined direction so as to position the substrate in place. Then, the first transfer robot 10 takes the substrate out of the aligner 12 and transfers the substrate to the ultraviolet ray radiation chamber 218. In the ultraviolet ray radiation chamber 218, ultraviolet rays are applied to the surface (to be plated) of the substrate. Thereafter, the first transfer robot 10 takes the substrate out of the ultraviolet ray radiation chamber 218 and transfers the substrate to the temporary placement stage 8. Then, the substrate is subjected to the subsequent processes as described above.

Figure 11:
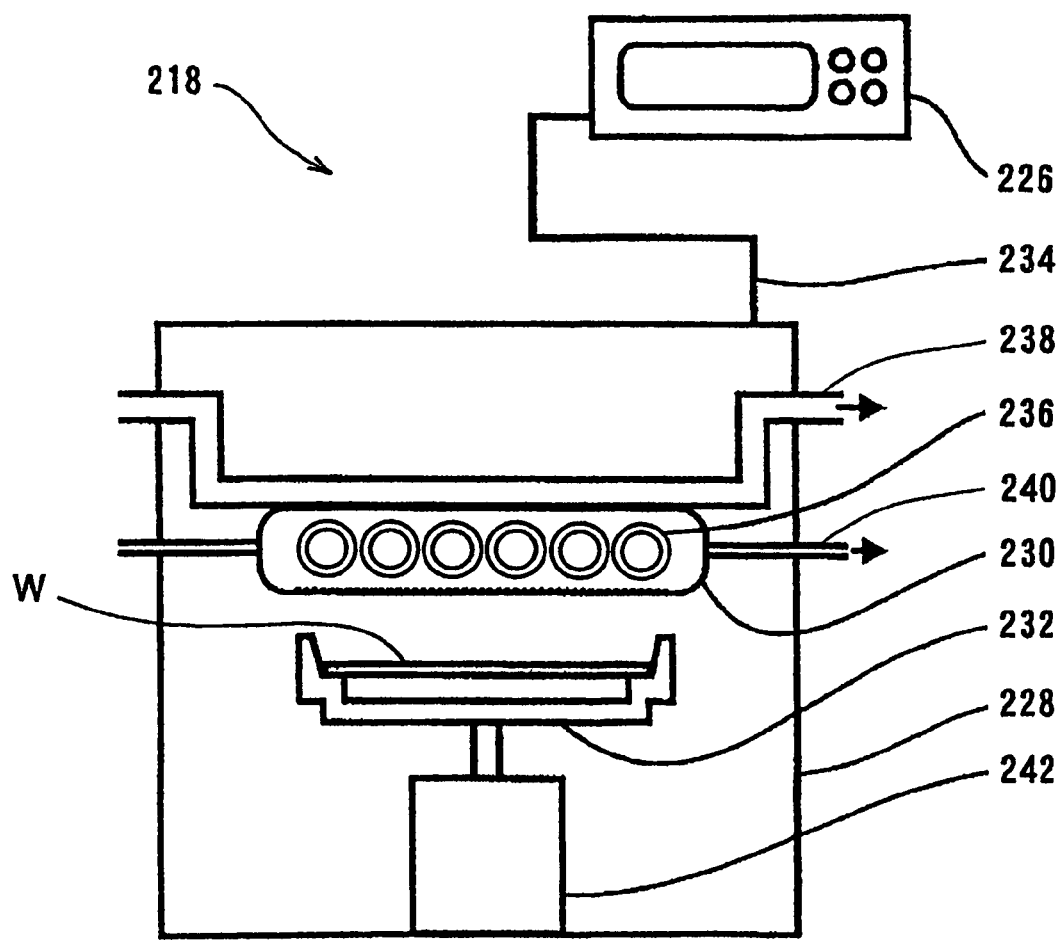
FIG. 11 is a schematic view showing an ultraviolet ray radiation chamber in the plating apparatus shown in FIG. 10.

FIG. 11 illustrates an example of the ultraviolet ray radiation chamber 218 in the dry station area. As shown in FIG. 11, the ultraviolet ray radiation chamber 218 includes a power source 226 for excimer lamps and a lamp frame 228. The power source 226 may be disposed outdoor. The lamp frame 228 includes therein an arm 232 disposed at a lower portion of the lamp frame 228 for detachably holding a substrate W in a state such that a surface (to be plated) of a substrate W faces upward, and an excimer photon source 230 disposed at an upper portion of the lamp frame 228 for applying excimer photons to the surface of the substrate W. The excimer photon source 230 is connected through a cable 234 to the power source 226. The excimer photon source 230 includes a plurality of excimer lamps 236, positioned in parallel to the horizontal plane, with dielectric barrier discharges, a cooling water passage 238, and a hydrogen gas passage 240. The arm 232 is operable to be horizontally rotated by a motor 242.

The substrate W is held horizontally by the arm 232 and rotated horizontally by the motor 242. The excimer lamps 236 apply ultraviolet rays (UV rays) to the entire upper surface (to be plated) of the substrate W. Thus, the ultraviolet rays (UV rays) can be applied uniformly to the upper surface (to be plated) of the substrate W.

By applying ultraviolet rays to the surface (to be plated) of the substrate W prior to the plating process, the wettability of the surface of the substrate can be improved when a plating process is performed directly on the surface of the substrate W to form interconnections in the substrate W. Application of ultraviolet rays to a surface of a substrate can improve the wettability of the surface of the substrate according to the following principle.

Figure 12A:
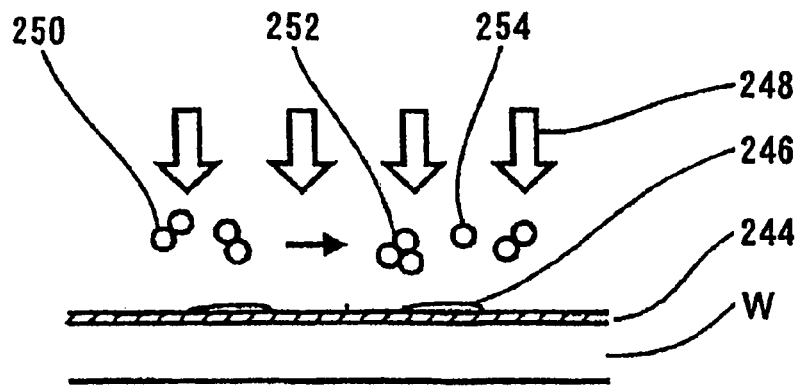
FIGS. 12A through 12D are diagrams showing processes including applying ultraviolet rays to a surface of a substrate and plating the surface of the substrate.
Figure 12B:
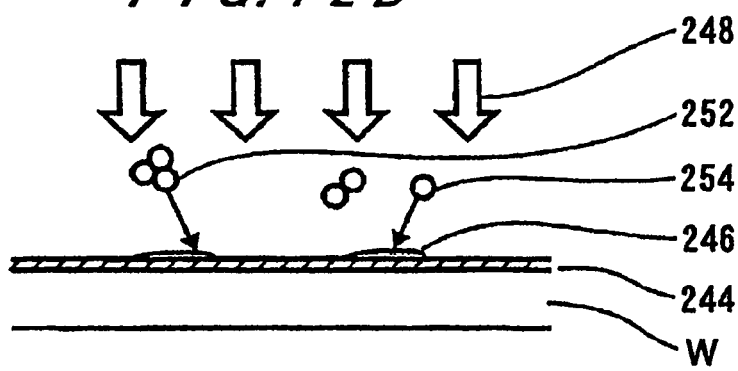
Figure 12C:
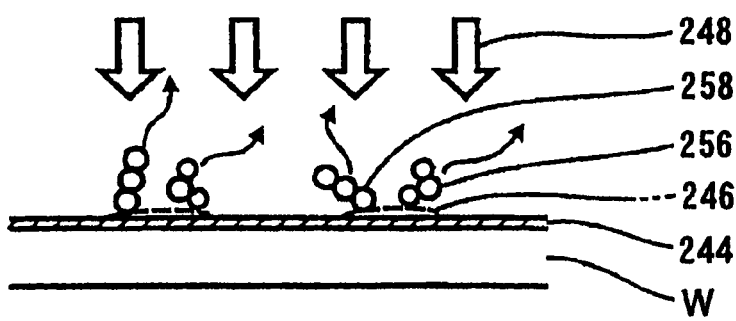

Even if a surface of a substrate is cleaned thoroughly, it is difficult to maintain conditions in which organic matter is completely prevented from being attached to the surface of the substrate from an atmosphere for a long term. Thus, as shown in FIG. 12A, a small amount of organic substance 246 is attached onto a surface (to be plated) of an underlying film 244 such as a seed layer formed on a surface of a substrate W. When ultraviolet rays 248 are applied to the surface of the substrate W, the ultraviolet rays 248 react with oxygen molecules 250 in the air to produce ozone molecules 252 and excited oxygen atoms 254. Accordingly, as shown in FIG. 12B, the ozone molecules 252 and the excited oxygen atoms 254 collide with the organic substance 246 remaining on the surface of the substrate W. As a result, the organic substance 246 is oxidized and decomposed by the ozone molecules 252 and the excited oxygen atoms 254. Thus, as shown in FIG. 12C, the organic substance 246 is volatilized as $H_2O$ 256 or $CO_2$ 258 and removed from the surface of the substrate as shown by imaginary lines.

Figure 12D:
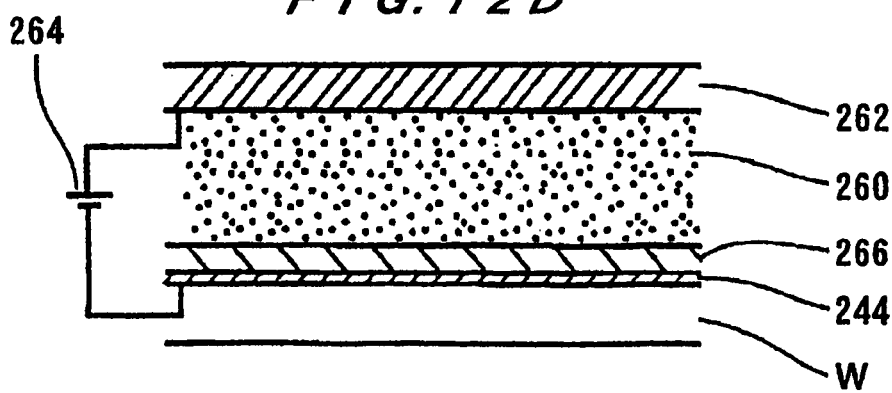

In this manner, the organic substance 246 can completely be removed from the surface of the substrate W so as to improve the wettability of the surface of the substrate W. As shown in FIG. 12D, the surface of the underlying film 244 of the substrate W is brought into contact with a plating solution 260, and a plating voltage is applied between the underlying film 244 and an anode 262 by a power source 264. At that time, fine air bubbles (micro air voids), which cause plating defects, can be eliminated on the surface of the underlying film 244. Thus, a plated film 266 can satisfactorily be formed on the surface of the underlying film 244.

Figure 13A:
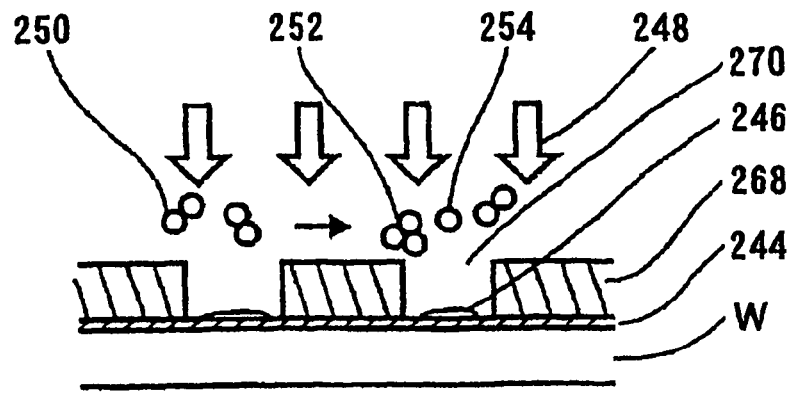
FIGS. 13A through 13D are diagrams showing processes including applying ultraviolet rays to a surface of a substrate having a resist pattern thereon and plating the surface of the substrate.

There will be described a case in which an organic resist film having a resist pattern formed therein is applied on the surface of the substrate W. As shown in FIG. 13A, a resist film 268 is applied to the surface of the underlying film 244 formed on the substrate W, and a resist pattern 270 is formed in the resist film 268 before a plating process is performed to form interconnections or bumps. Generally, a resist film has poor wettability. Accordingly, if organic substance 246 exists on exposed surfaces of the underlying film 244 at the bottom of the resist pattern 270, then plating defects are likely to be caused.

Figure 13B:
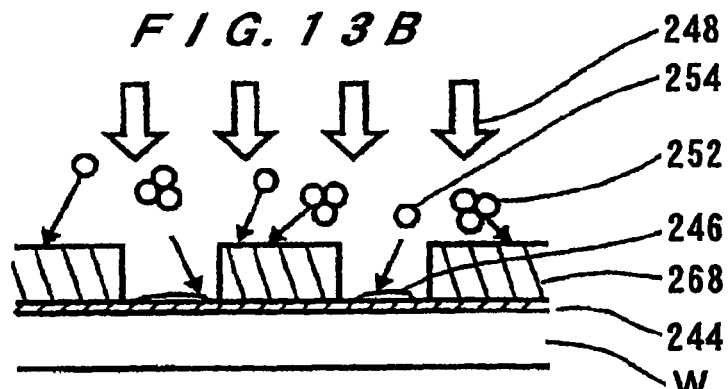
Figure 13C:
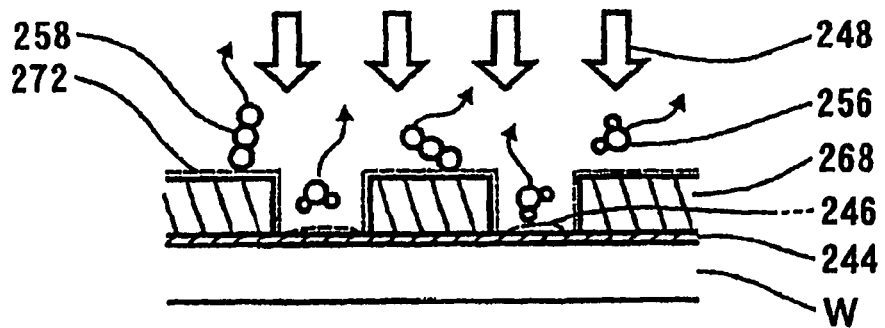

When ultraviolet rays 248 are applied to the surface of the substrate W, the ultraviolet rays 248 react with oxygen molecules 250 in the air to produce ozone molecules 252 and excited oxygen atoms 254. Accordingly, as shown in FIG. 13B, the ozone molecules 252 and the excited oxygen atoms 254 collide with the surfaces of the resist film 268 to cut molecular bindings of molecules of the surfaces to bond a hydrophilic group such as a COOH group or an OH group to side chains of the molecules. Thus, as shown in FIG. 13C, reformed surfaces 272 having improved wettability are formed on the surfaces of the resist film 268. Further, the ozone molecules 252 and the excited oxygen atoms 254 collide with the organic substance 246 remaining on the exposed surfaces of the underlying film 244 at the bottoms of the resist pattern 270. As a result, the organic substance 246 is oxidized and decomposed by the ozone molecules 252 and the excited oxygen atoms 254. Thus, as shown in FIG. 13C, the organic substance 246 is volatilized as $H_2O$ 256 or $CO_2$ 258 and removed from the exposed surfaces of the underlying film 244. Accordingly, the wettability can be improved on the exposed surfaces of the underlying film 244 at the bottoms of the resist pattern 270.

Figure 13D:
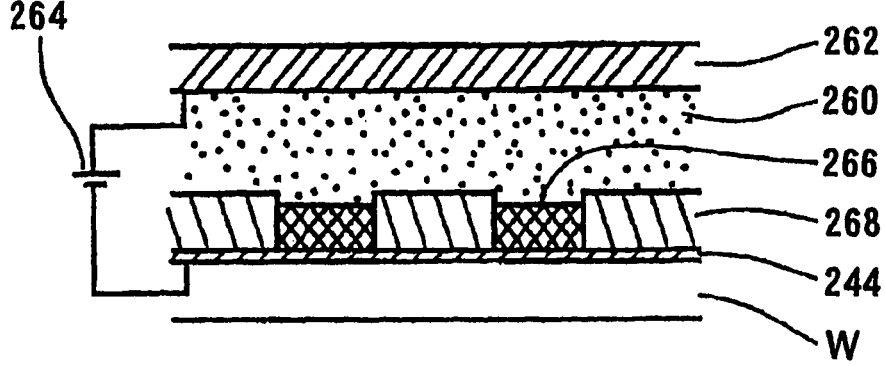

In this manner, the wettability can be improved on the surfaces of the resist film 268 and on the exposed surfaces of the underlying film 244 at the bottoms of the resist pattern 270. As shown in FIG. 13D, the surface of the substrate W is brought into contact with a plating solution 260, and a plating voltage is applied between the underlying film 244 and an anode 262 by a power source 264. At that time, fine air bubbles (micro air voids), which cause plating defects, can be eliminated on the surface of the substrate W. Thus, a plated film 266 can satisfactorily be formed on the exposed surfaces of the underlying film 244 at the bottom of the resist pattern 270.

In the present embodiment, ultraviolet rays are applied to the surface of the substrate by the excimer lamps with dielectric barrier discharges. However, ultraviolet rays may be applied to the surface of the substrate by a UV lamp, a low-pressure mercury lamp, an ArF excimer laser, or the like.

Figure 14:
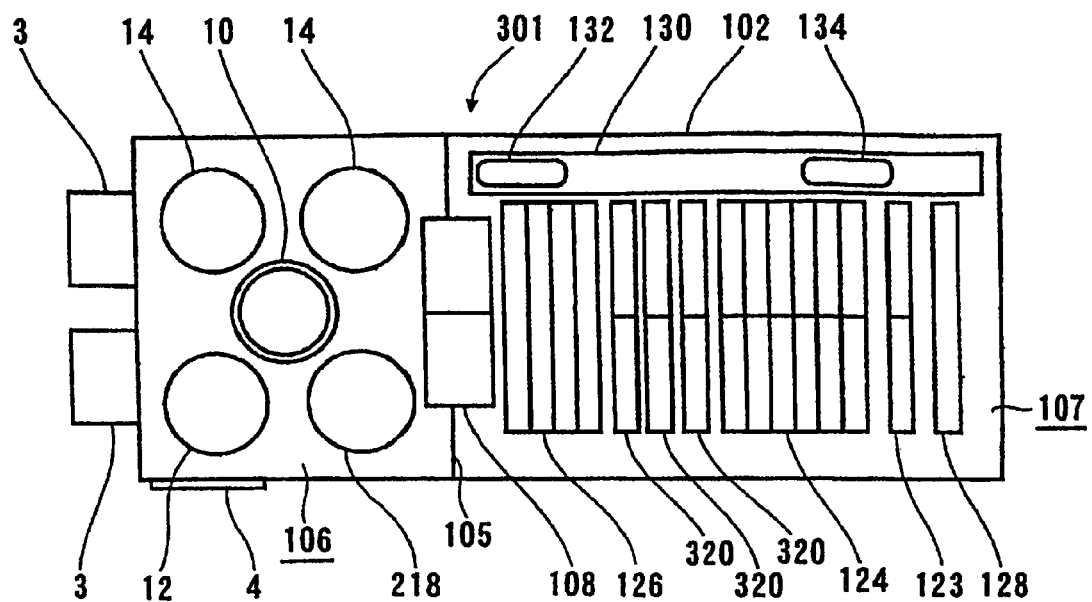
FIG. 14 is a plan view showing a plating apparatus according to a fourth embodiment of the present invention.

FIG. 14 illustrates a plating apparatus 301 according to a fourth embodiment of the present invention. The plating apparatus 301 has an ultraviolet ray radiation chamber 218 instead of one of the three cleaning and drying chambers 14 disposed in the dry station area 106 of the plating apparatus 101 in the second embodiment shown in FIG. 5. Further, the wet station area 107 includes therein three rinsing chambers 320 for performing a pre-treatment process (rinsing process) on a surface (to be plated) of a substrate, a plating chamber 124 for performing a plating process on the surface of the substrate, a cleaning chamber 123 for cleaning the substrate, a stocker 126 for storing and temporarily holding substrate holders, and a blowing chamber 128 for drying the substrate.

With the plating apparatus 301 having the above arrangement, the first transfer robot 10 takes a substrate out of a substrate cassette loaded on one of the loading/unloading chambers 3 and transfers the substrate to the aligner 12. In the aligner 12, an orientation flat or a notch formed in the substrate is aligned in a predetermined direction so as to position the substrate in place. Then, the first transfer robot 10 takes the substrate out of the aligner 12 and transfers the substrate to the ultraviolet ray radiation chamber 218. In the ultraviolet ray radiation chamber 218, ultraviolet rays are applied to the surface (to be plated) of the substrate. Thereafter, the first transfer robot 10 takes the substrate out of the ultraviolet ray radiation chamber 218 and transfers the substrate to the substrate loading stage 108. At the substrate loading stages 108, substrates are loaded into the substrate holders 136 (see FIG. 6). Then, the substrates are subjected to the subsequent processes in a vertical state as described above.

Figure 15:
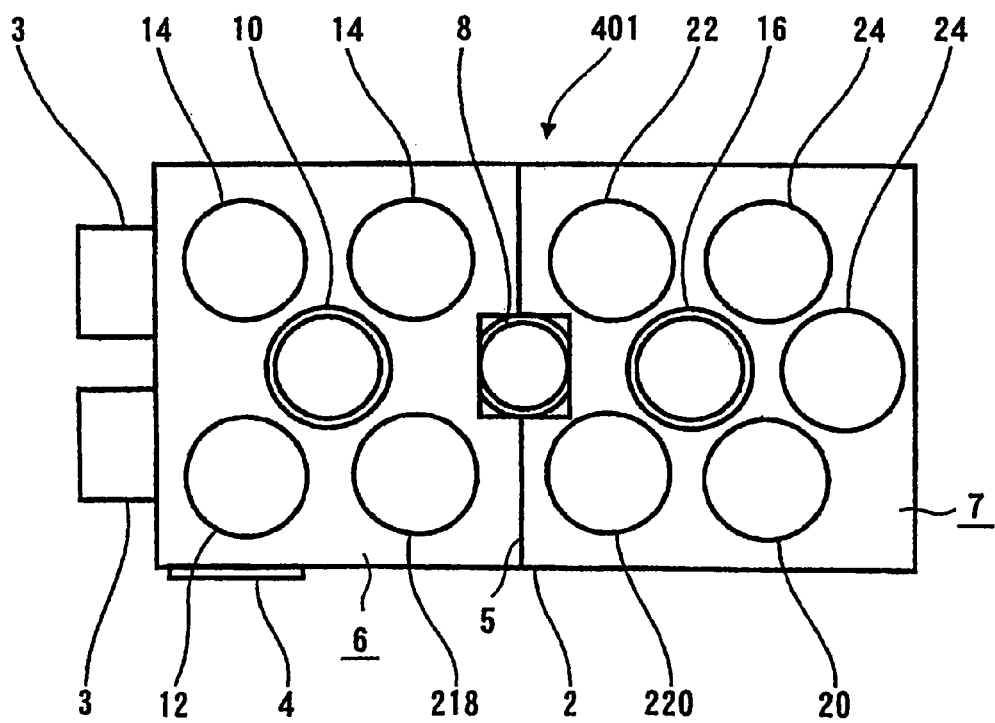
FIG. 15 is a plan view showing a plating apparatus according to a fifth embodiment of the present invention.

FIG. 15 illustrates a plating apparatus 401 according to a fifth embodiment of the present invention. The plating apparatus 401 has an acid treatment chamber 20 for processing the surface of the substrate with an acid liquid, instead of one of the two rinsing chamber 220 disposed in the wet station area 7 of the plating apparatus 201 in the third embodiment shown in FIG. 10. Further, the three plating chambers 224 in the third embodiment, which also can roughly clean the substrate, are replaced with a cleaning chamber 22 and two plating chambers 24. The acid treatment chamber 20 has the same structure as the acid treatment chamber 20 in the first embodiment (see FIG. 3).

With the plating apparatus 401 having the above arrangement, a substrate is subjected to a pre-treatment process of a rinsing process in the rinsing chamber 220 and transferred to the acid treatment chamber 20. In the acid treatment chamber 20, the substrate is processed with an acid liquid so as to activate a surface (to be plated) of the substrate. The substrate which has been subjected to the acid treatment is transferred to the cleaning chamber 22, where the surface of the substrate is cleaned. Then, the substrate is transferred to the plating chamber 24, where a plating process is performed on the surface of the substrate.

Figure 16A:
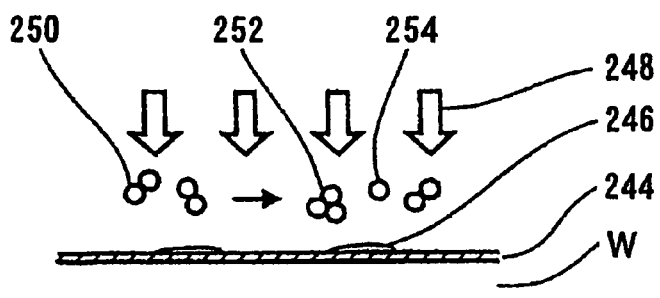
FIGS. 16A through 16E are diagrams showing processes including applying ultraviolet rays to a surface of a substrate, processing the substrate with an acid liquid, and plating the surface of the substrate.
Figure 16B:
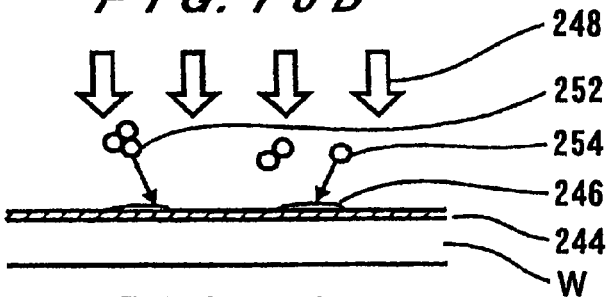
Figure 16C:
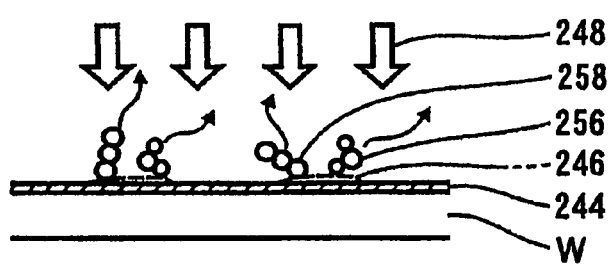
Figure 16D:
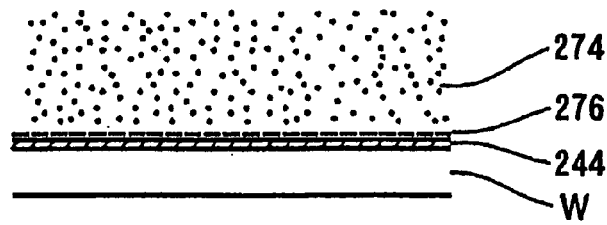
Figure 16E:
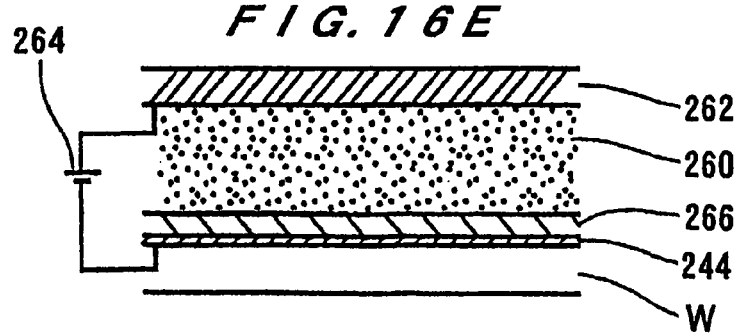

As described above, ultraviolet rays are applied to the surface of the substrate prior to the plating process. Thus, as shown in FIGS. 16A through 16C, the wettability of a surface (to be plated) of an underlying film 244 of the substrate W can be improved. Further, as shown in FIG. 16D, an acid liquid 274 is brought into contact with the surface of the underlying film 244 of the substrate W to form an activated underlying surface 276 on the underlying film 244. Then, as shown in FIG. 16E, the substrate W is plated to deposit a plated film 266 on the surface of the underlying film 244 of the substrate W. Thus, it is possible to increase adhesion of the plated film 266 to the underlying film 244 of the substrate W and to achieve satisfactory plating without plating defects.

Figure 17:
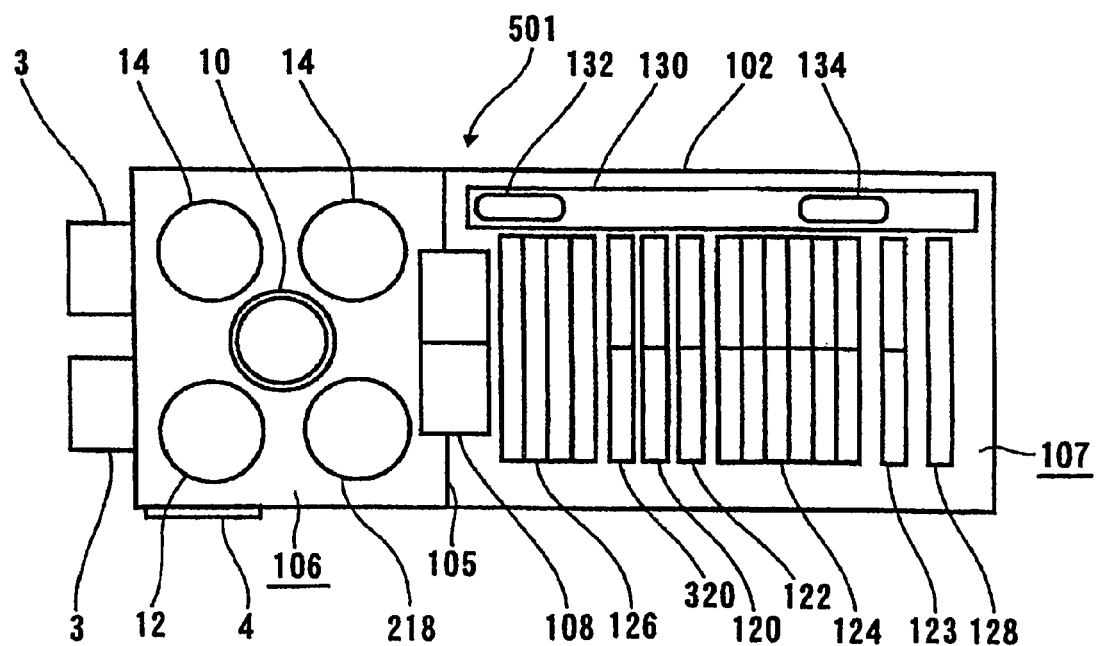
FIG. 17 is a plan view showing a plating apparatus according to a sixth embodiment of the present invention.

FIG. 17 illustrates a plating apparatus 501 according to a sixth embodiment of the present invention. The plating apparatus 501 has an acid treatment chamber 120 for processing a surface of a substrate with an acid liquid, instead of one of the three rinsing chambers 320 disposed in the wet station area 107 of the plating apparatus 301 in the fourth embodiment shown in FIG. 14. Further, the plating apparatus 501 has a cleaning chamber 122 instead of the other of the rinsing chambers 320. The acid treatment chamber 120 has the same structure as the acid treatment chamber 120 in the second embodiment (see FIG. 8).

With the plating apparatus 501 having the above arrangement, substrates are subjected to a pre-treatment process of a rinsing process in the rinsing chamber 320 and transferred to the acid treatment chamber 120. In the acid treatment chamber 120, the substrates are processed with an acid liquid so as to activate surfaces (to be plated) of the substrates. The substrates which have been subjected to the acid treatment are transferred to the cleaning chamber 122, where the surfaces of the substrates are cleaned. Then, the substrates are transferred to the plating chamber 124, where a plating process is performed on the surfaces of the substrates.

Figure 18:
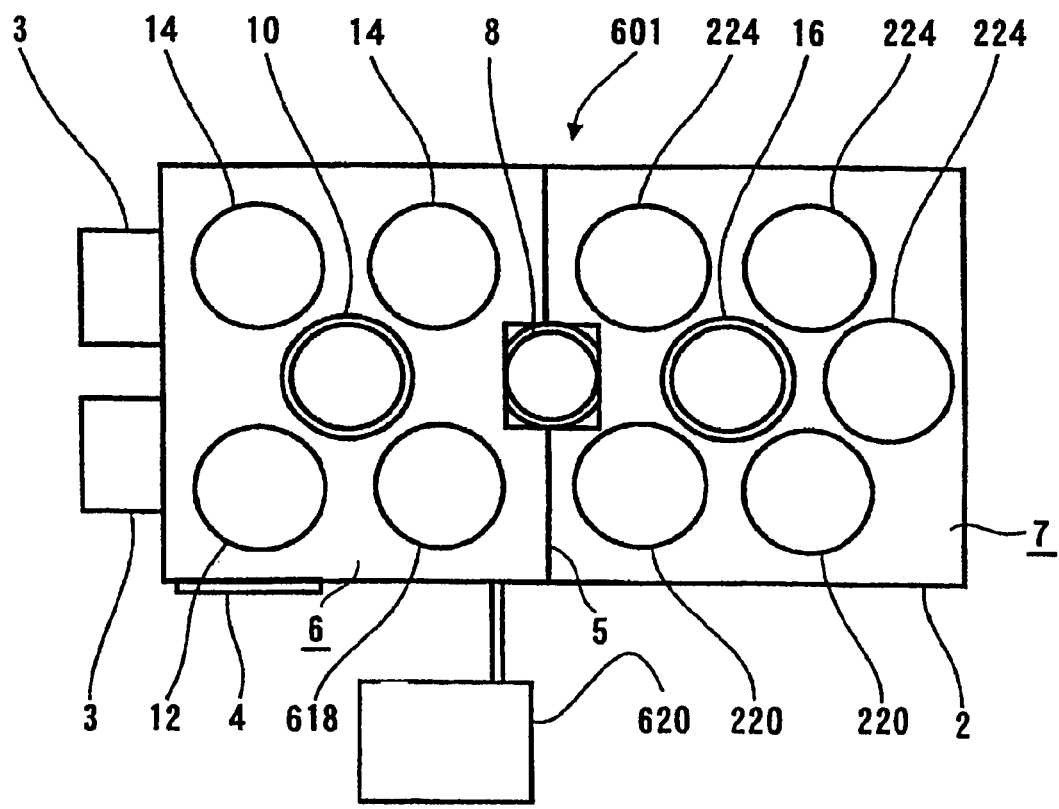
FIG. 18 is a plan view showing a plating apparatus according to a seventh embodiment of the present invention.

FIG. 18 illustrates a plating apparatus 601 according to a seventh embodiment of the present invention. The plating apparatus 601 has an ozonizer 620 disposed outside of the frame 2 for producing ozone. Further, the plating apparatus 601 has an ozone gas exposure chamber 618 instead of the ultraviolet ray radiation chamber 218 disposed in the dry station area 6 of the plating apparatus 201 in the third embodiment shown in FIG. 10.

With the plating apparatus 601 having the above arrangement, a substrate is aligned in a predetermined direction by the aligner 12 and transferred to the ozone gas exposure chamber 618. In the ozone gas exposure chamber 618, a surface (to be plated) of the substrate is exposed to ozone gas produced by the ozonizer 620. Thereafter, the first transfer robot 10 takes the substrate out of the ozone gas exposure chamber 618 and transfers the substrate to the temporary placement stage 8. Then, the substrate is subjected to the subsequent processes as described above.

By exposing the surface of the substrate to the ozone gas prior to the plating process, as with application of ultraviolet rays to the surface of the substrate, organic substance remaining on the surface of the substrate can be removed so as to improve the wettability of the surface of the substrate. The ozone gas preferably includes ozone at a volume fraction of at least 10%.

Figure 19:
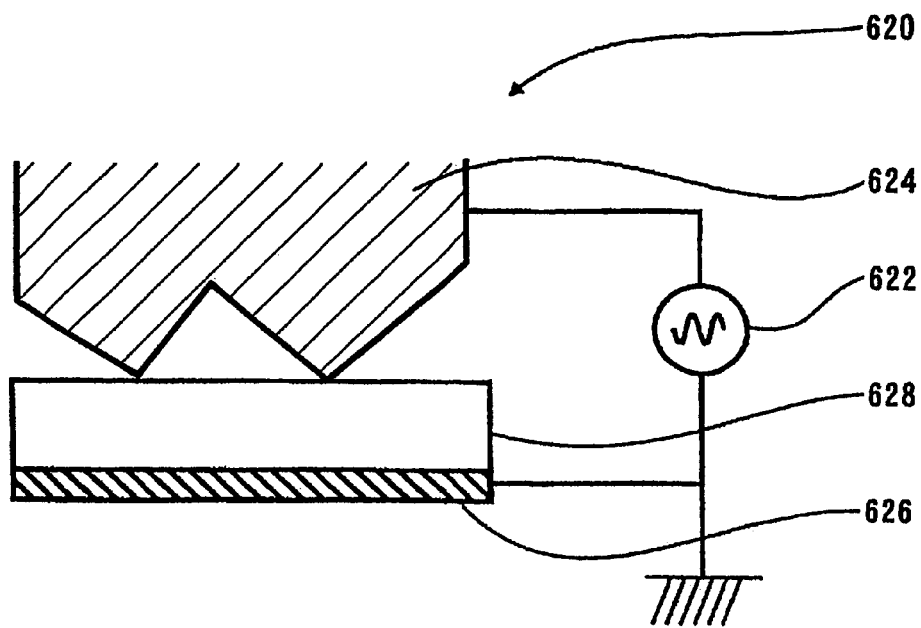
FIG. 19 is a schematic view showing an ozonizer in the plating apparatus shown in FIG. 18.

FIG. 19 illustrates an example of the ozonizer 620 (ozonizer discharger). The ozonizer 620 has an AC power source 622 having a high frequency and a high voltage, a high-voltage electrode 624 connected to the AC power source 622, an earth electrode 626, and a dielectric 628 disposed between the high-voltage electrode 624 and the earth electrode 626. The ozonizer 620 is configured to discharge electricity in oxygen gas so as to produce ozone gas.

Figure 20:
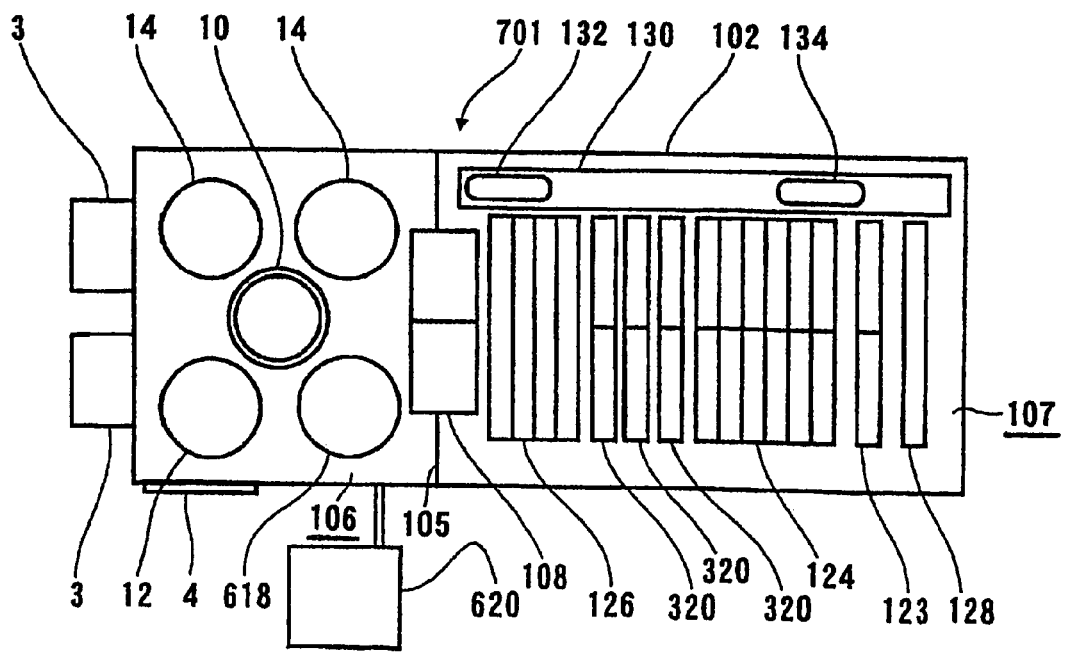
FIG. 20 is a plan view showing a plating apparatus according to an eighth embodiment of the present invention.

FIG. 20 illustrates a plating apparatus 701 according to an eighth embodiment of the present invention. The plating apparatus 701 has an ozonizer 620 disposed outside of the frame 102 for producing ozone. Further, the plating apparatus 701 has an ozone gas exposure chamber 618 instead of the ultraviolet ray radiation chamber 218 disposed in the dry station area 106 of the plating apparatus 301 in the fourth embodiment shown in FIG. 14.

With the plating apparatus 701 having the above arrangement, a substrate is aligned in a predetermined direction by the aligner 12 and transferred to the ozone gas exposure chamber 618. In the ozone gas exposure chamber 618, a surface (to be plated) of the substrate is exposed to ozone gas produced by the ozonizer 620. Thereafter, the first transfer robot 10 takes the substrate out of the ozone gas exposure chamber 618 and transfers the substrate to the substrate loading stage 108. At the substrate loading stages 108, substrates are loaded into the substrate holders 136 (see FIG. 6). Then, the substrates are subjected to the subsequent processes in a vertical state as described above.

Figure 21:
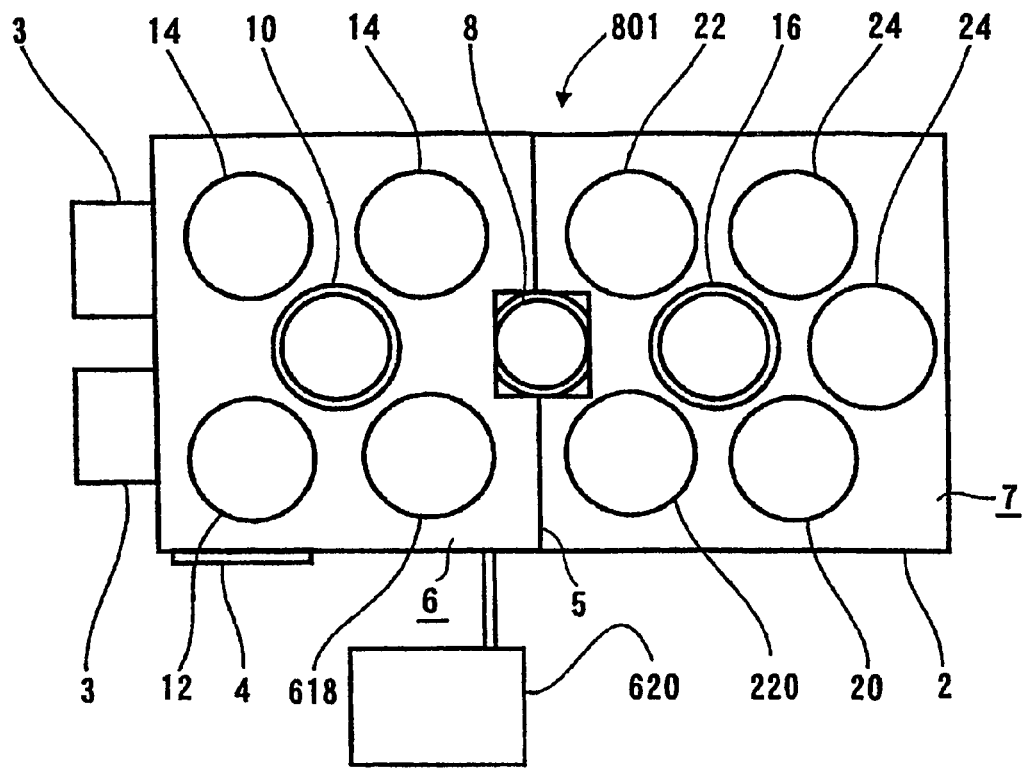
FIG. 21 is a plan view showing a plating apparatus according to a ninth embodiment of the present invention.

FIG. 21 illustrates a plating apparatus 801 according to a ninth embodiment of the present invention. The plating apparatus 801 has an acid treatment chamber 20 for processing a surface of a substrate with an acid liquid, instead of one of the two rinsing chambers 220 disposed in the wet station area 7 of the plating apparatus 601 in the seventh embodiment shown in FIG. 18. Further, the three plating chambers 224 in the seventh embodiment, which also can roughly clean the substrate, are replaced with a cleaning chamber 22 and two plating chambers 24.

With the plating apparatus 801 having the above arrangement, a substrate is subjected to a pre-treatment process of a rinsing process in the rinsing chamber 220 and transferred to the acid treatment chamber 20. In the acid treatment chamber 20, the substrate is processed with an acid liquid so as to activate a surface (to be plated) of the substrate. The substrate which has been subjected to the acid treatment is transferred to the cleaning chamber 22, where the surface of the substrate is cleaned. Then, the substrate is transferred to the plating chamber 24, where a plating process is performed on the surface of the substrate.

Figure 22:
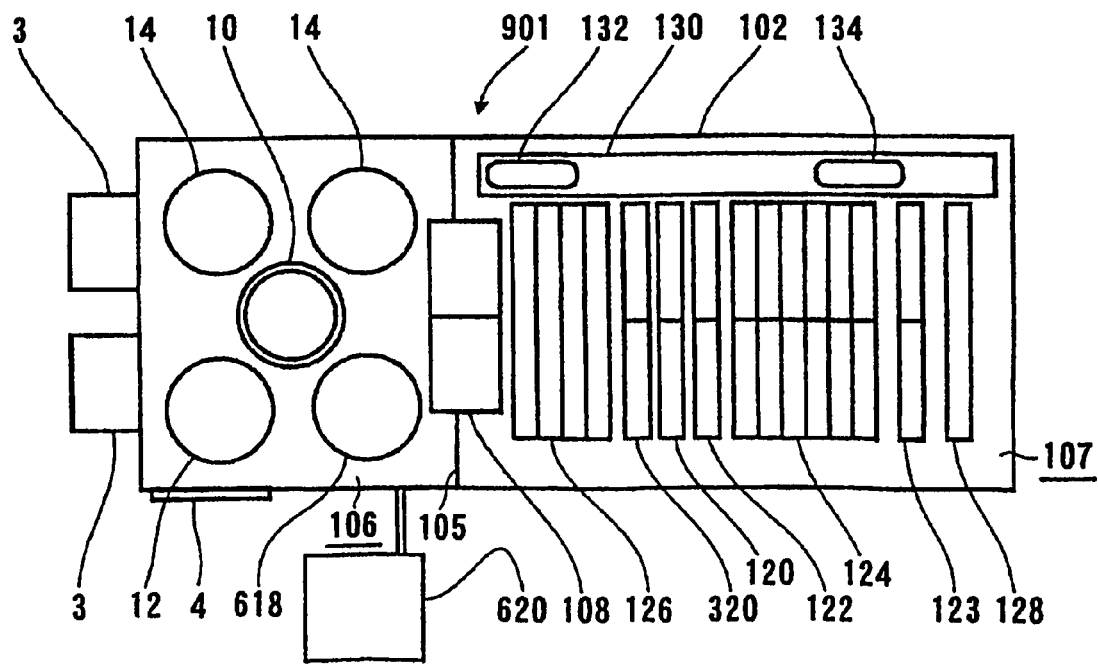
FIG. 22 is a plan view showing a plating apparatus according to a tenth embodiment of the present invention.

FIG. 22 illustrates a plating apparatus 901 according to a tenth embodiment of the present invention. The plating apparatus 901 has an acid treatment chamber 120 for processing a surface of a substrate with an acid liquid, instead of one of the three rinsing chambers 320 disposed in the wet station area 107 of the plating apparatus 701 in the eighth embodiment shown in FIG. 20. Further, the plating apparatus 901 has a cleaning chamber 122 instead of the other of the rinsing chambers 320.

With the plating apparatus 901 having the above arrangement, substrates are subjected to a pre-treatment process of a rinsing process in the rinsing chamber 320 and transferred to the acid treatment chamber 120. In the acid treatment chamber 120, the substrates are processed with an acid liquid so as to activate surfaces (to be plated) of the substrates. The substrates which have been subjected to the acid treatment are transferred to the cleaning chamber 122, where the surfaces of the substrates are cleaned. Then, the substrates are transferred to the plating chamber 124, where a plating process is performed on the surfaces of the substrates.

Figure 23:
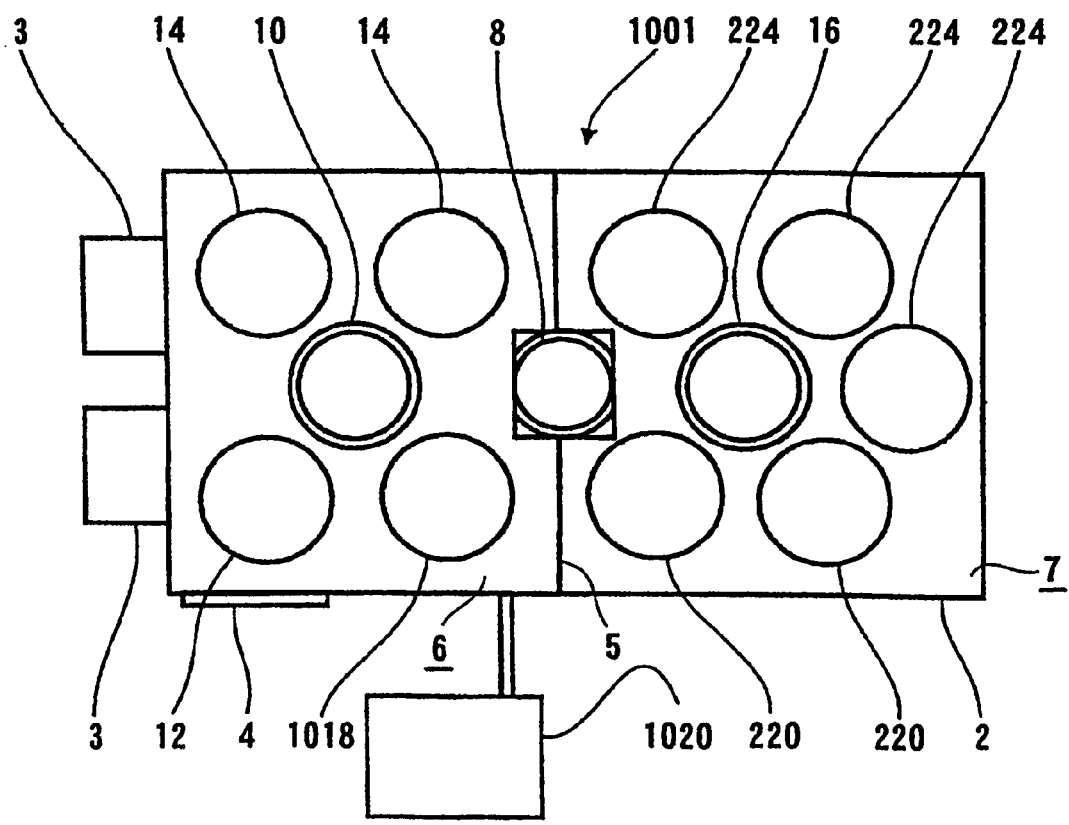
FIG. 23 is a plan view showing a plating apparatus according to an eleventh embodiment of the present invention.

FIG. 23 illustrates a plating apparatus 1001 according to an eleventh embodiment of the present invention. The plating apparatus 1001 has an ozone water generator 1020 disposed outside of the frame 2 for producing ozone water. Further, the plating apparatus 1001 has an ozone water process chamber 1018 instead of the ultraviolet ray radiation chamber 218 disposed in the dry station area 6 of the plating apparatus 201 in the third embodiment shown in FIG. 10.

With the plating apparatus 1001 having the above arrangement, a substrate is aligned in a predetermined direction by the aligner 12 and transferred to the ozone water process chamber 1018. In the ozone water process chamber 1018, ozone water generated by the ozone water generator 1020 is brought into contact with a surface (to be plated) of the substrate. Thereafter, the first transfer robot 10 takes the substrate out of the ozone water process chamber 1018 and transfers the substrate to the temporary placement stage 8. Then, the substrate is subjected to the subsequent processes as described above.

By bringing the surface of the substrate into contact with the ozone water prior to the plating process, as with application of ultraviolet rays to the surface of the substrate, organic substance remaining on the surface of the substrate can be removed so as to improve the wettability of the surface of the substrate.

FIG. 24 illustrates an example of the ozone water generator 1020. As shown in FIG. 24, the ozone water generator 1020 has an ozonizer 620 for producing ozone gas from oxygen supplied through an oxygen supply pipe 1022, and an ozone dissolution membrane (hollow fiber membrane) 1024 made of, for example, fluororesin. The ozone gas produced by the ozonizer 620 is introduced through an ozone gas pipe 1026 into the ozone dissolution membrane 1024. Further, ultrapure water is supplied through an ultrapure water pipe 1034 into the ozone dissolution membrane 1024. The ozone gas is dissolved in the pure water by diffusion and dissolution through ozone dissolution membrane 1024 so as to produce ozone water. Exhaust gas produced at that time is discharged through an exhaust gas pipe 1036. The ultrapure water pipe 1034 has a pump 1028, a filter 1030, and a flowmeter 1032 provided thereon.

Figure 25:
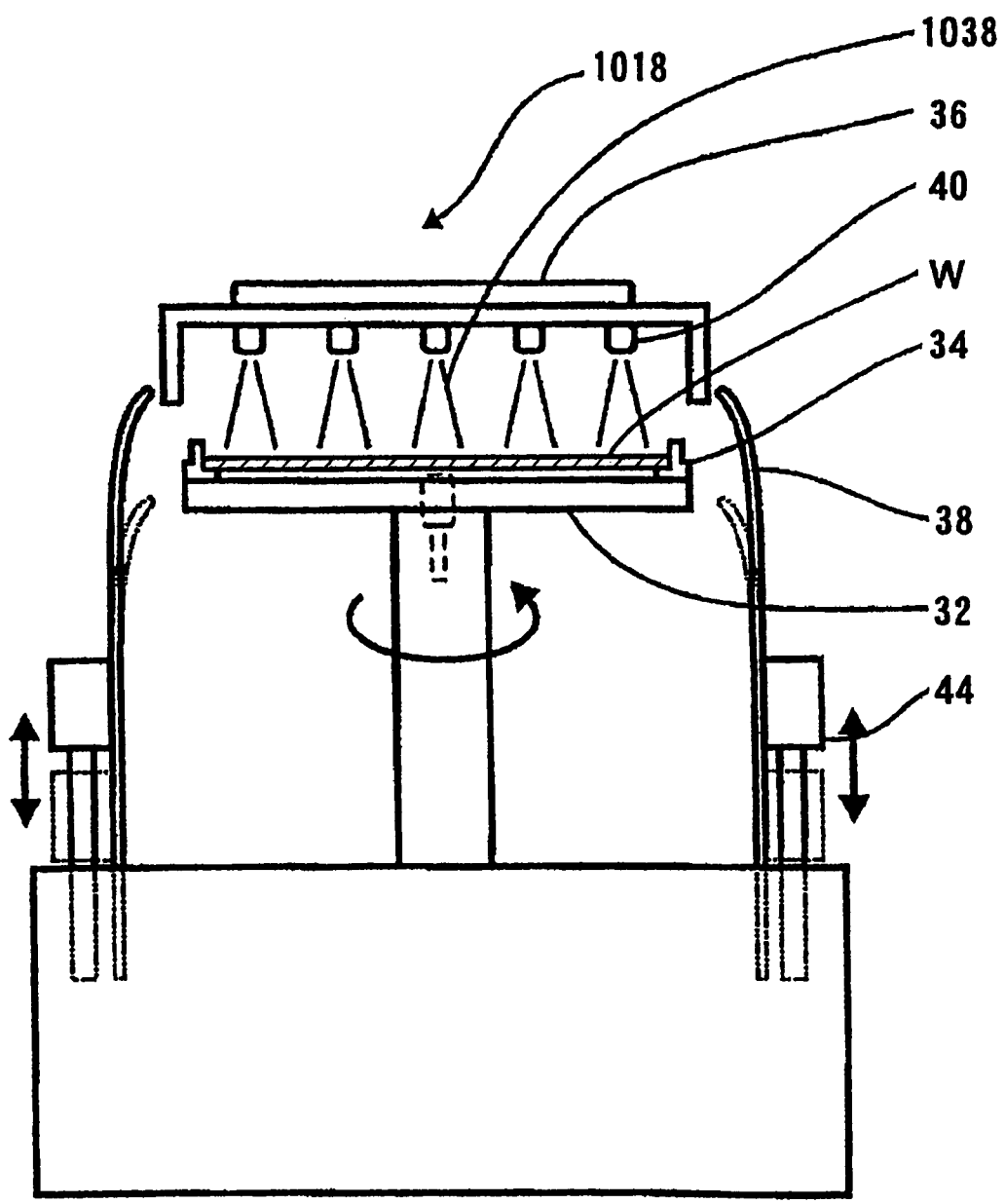
FIG. 25 is a schematic view showing an ozone water process chamber in the plating apparatus shown in FIG. 23.

FIG. 25 illustrates an example of the ozone water process chamber 1018, which processes a substrate in a horizontal state. The ozone water process chamber 1018 has substantially the same structure as the acid treatment chamber 20 shown in FIG. 3. The ozone water process chamber 1018 differs from the acid treatment chamber 20 in that ozone water 1038 is sprayed from spray heads 40 onto an upper surface of the substrate W instead of the acid liquid 42.

Figure 26:
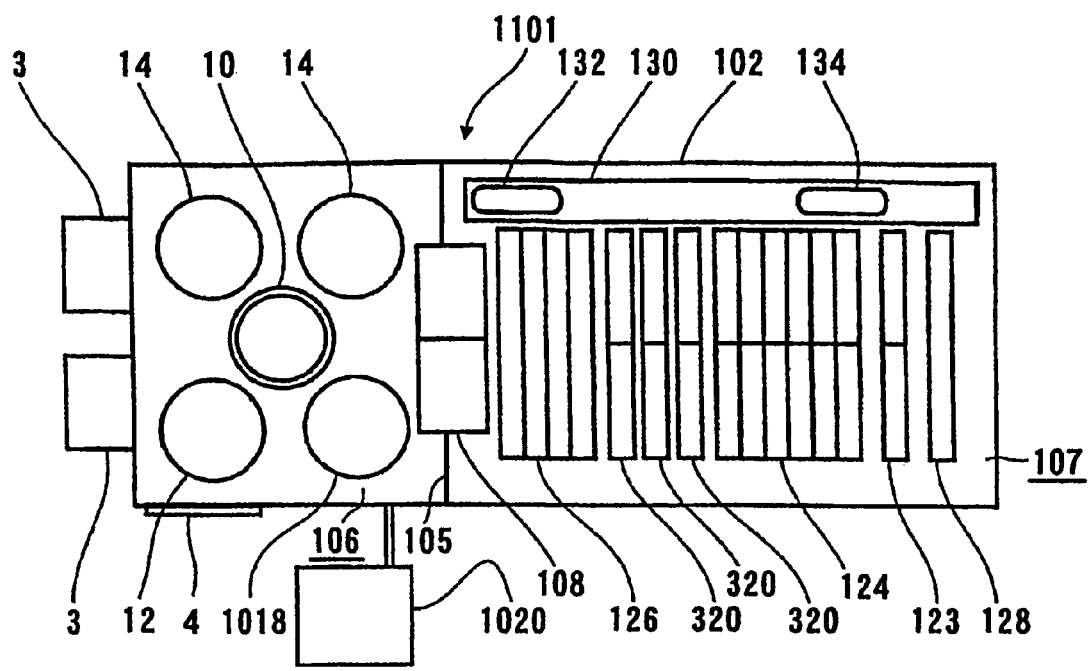
FIG. 26 is a plan view showing a plating apparatus according to a twelfth embodiment of the present invention.

FIG. 26 illustrates a plating apparatus 1101 according to a twelfth embodiment of the present invention. The plating apparatus 1101 has an ozone water generator 1020 disposed outside of the frame 102 for producing ozone water. Further, the plating apparatus 1101 has an ozone water process chamber 1018 instead of the ultraviolet ray radiation chamber 218 disposed in the dry station area 106 of the plating apparatus 301 in the fourth embodiment shown in FIG. 14.

With the plating apparatus 1101 having the above arrangement, a substrate is aligned in a predetermined direction by the aligner 12 and transferred to the ozone water process chamber 1018. In the ozone water process chamber 1018, ozone water generated by the ozone water generator 1020 is brought into contact with a surface (to be plated) of the substrate. Thereafter, the first transfer robot 10 takes the substrate out of the ozone water process chamber 1018 and transfers the substrate to the substrate loading stage 108. At the substrate loading stages 108, substrates are loaded into the substrate holders 136 (see FIG. 6). Then, the substrates are subjected to the subsequent processes in a vertical state as described above.

Figure 27:
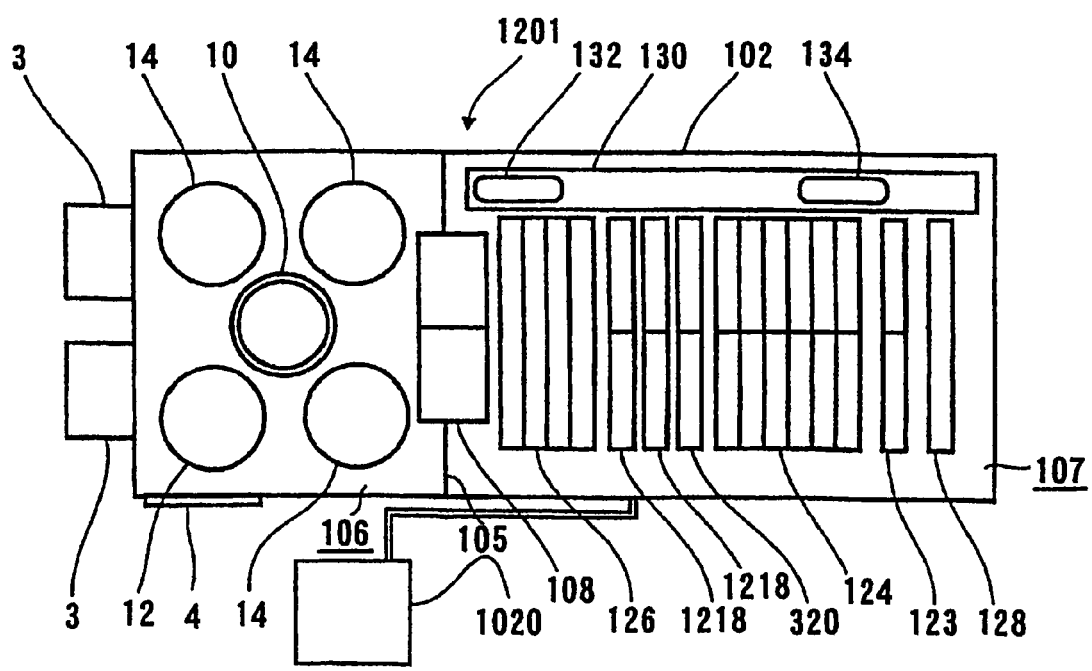
FIG. 27 is a plan view showing a plating apparatus according to a thirteenth embodiment of the present invention.

FIG. 27 illustrates a plating apparatus 1201 according to a thirteenth embodiment of the present invention. The plating apparatus 1201 has an ozone water generator 1020 disposed outside of the frame 102 for producing ozone water. The plating apparatus 1201 has two ozone water process chambers 1218 instead of the steam treatment chamber 118 and the acid treatment chamber 120 disposed in the wet station area 107 of the plating apparatus 101 in the second embodiment shown in FIG. 5. Further, the plating apparatus 1201 has a rinsing chamber 320 instead of the cleaning chamber 122. The rinsing chamber 320 is disposed downstream of the two ozone water process chambers 1218. In each of the ozone water process chambers 1218, ozone water generated by the ozone water generator 1020 is brought into contact with surfaces (to be plated) of the substrates. Thereafter, the substrates are subjected to a pre-treatment process of a rinsing process in the rinsing chamber 320. Then, a plating process is performed on the surfaces of the substrates in the plating chamber 124.

Figure 28:
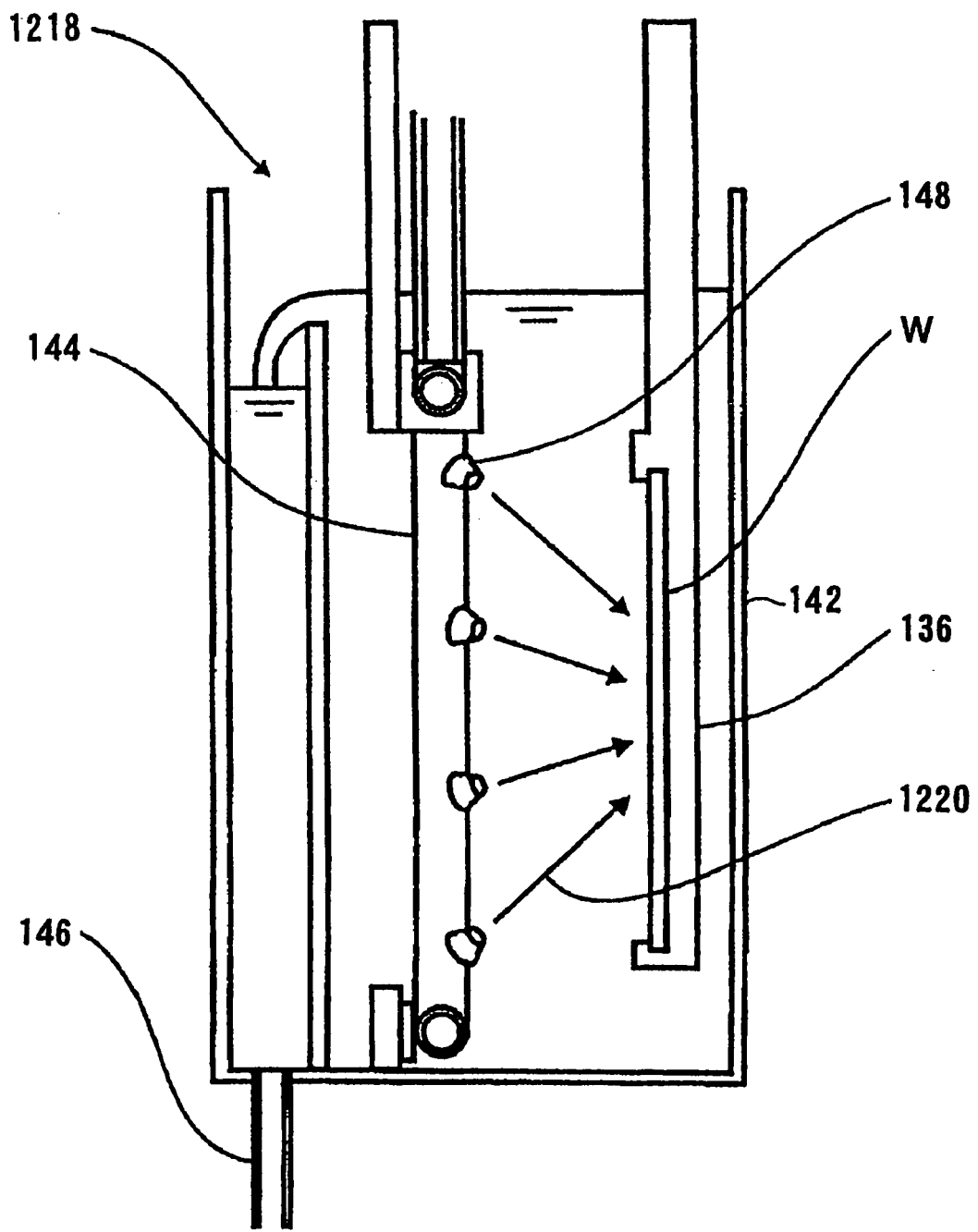
FIG. 28 is a schematic view showing an ozone water process chamber in the plating apparatus shown in FIG. 27.

FIG. 28 illustrates an example of the ozone water process chamber 1218, which processes substrates in a vertical state. The ozone water process chamber 1218 has substantially the same structure as the acid treatment chamber 120 shown in FIG. 8. The ozone water process chamber 1218 differs from the acid treatment chamber 120 in that ozone water 1220 is ejected from ejection nozzles 148 to surfaces (to be plated) of the substrates W instead of the acid liquid 42.

Figure 29:
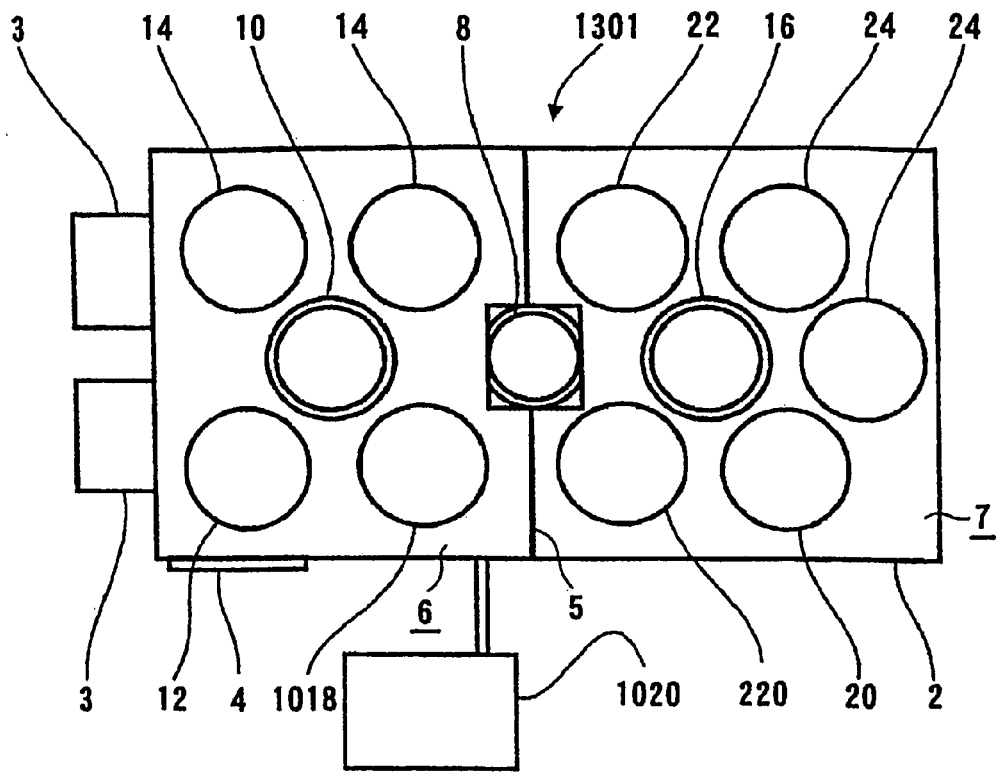
FIG. 29 is a plan view showing a plating apparatus according to a fourteenth embodiment of the present invention.

FIG. 29 illustrates a plating apparatus 1301 according to a fourteenth embodiment of the present invention. The plating apparatus 1301 has an acid treatment chamber 20 for processing a surface of a substrate with an acid liquid, instead of one of the two rinsing chambers 220 disposed in the wet station area 7 of the plating apparatus 1001 in the eleventh embodiment shown in FIG. 23. Further, the three plating chambers 224 in the eleventh embodiment, which also can roughly clean the substrate, are replaced with a cleaning chamber 22 and two plating chambers 24.

With the plating apparatus 1301 having the above arrangement, a substrate is subjected to a pre-treatment process of a rinsing process in the rinsing chamber 220 and transferred to the acid treatment chamber 20. In the acid treatment chamber 20, the substrate is processed with an acid liquid so as to activate a surface (to be plated) of the substrate. The substrate which has been subjected to the acid treatment is transferred to the cleaning chamber 22, where the surface of the substrate is cleaned. Then, the substrate is transferred to the plating chamber 24, where a plating process is performed on the surface of the substrate.

Figure 30:
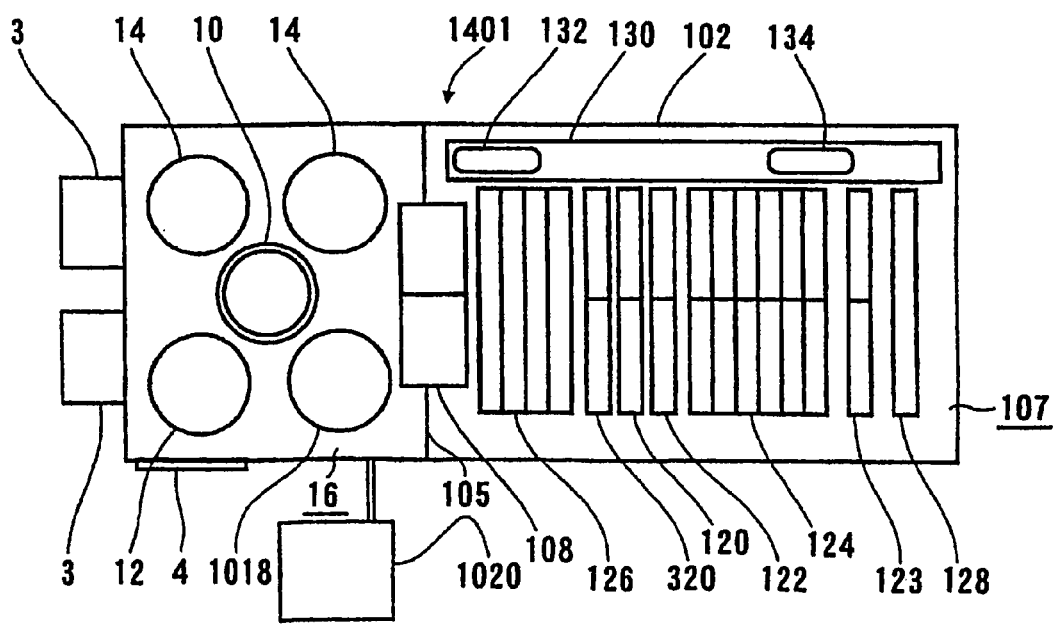
FIG. 30 is a plan view showing a plating apparatus according to a fifteenth embodiment of the present invention.

FIG. 30 illustrates a plating apparatus 1401 according to a fifteenth embodiment of the present invention. The plating apparatus 1401 has an acid treatment chamber 120 for processing a surface of a substrate with an acid liquid, instead of one of the three rinsing chambers 320 disposed in the wet station area 107 of the plating apparatus 1101 in the twelfth embodiment shown in FIG. 26. Further, the plating apparatus 1401 has a cleaning chamber 122 instead of the other of the rinsing chambers 320.

With the plating apparatus 1401 having the above arrangement, substrates are subjected to a pre-treatment process of a rinsing process in the rinsing chamber 320 and transferred to the acid treatment chamber 120. In the acid treatment chamber 120, the substrates are processed with an acid liquid so as to activate surfaces (to be plated) of the substrates. The substrates which have been subjected to the acid treatment are transferred to the cleaning chamber 122, where the surfaces of the substrates are cleaned. Then, the substrates are transferred to the plating chamber 124, where a plating process is performed on the surfaces of the substrates.

Figure 31:
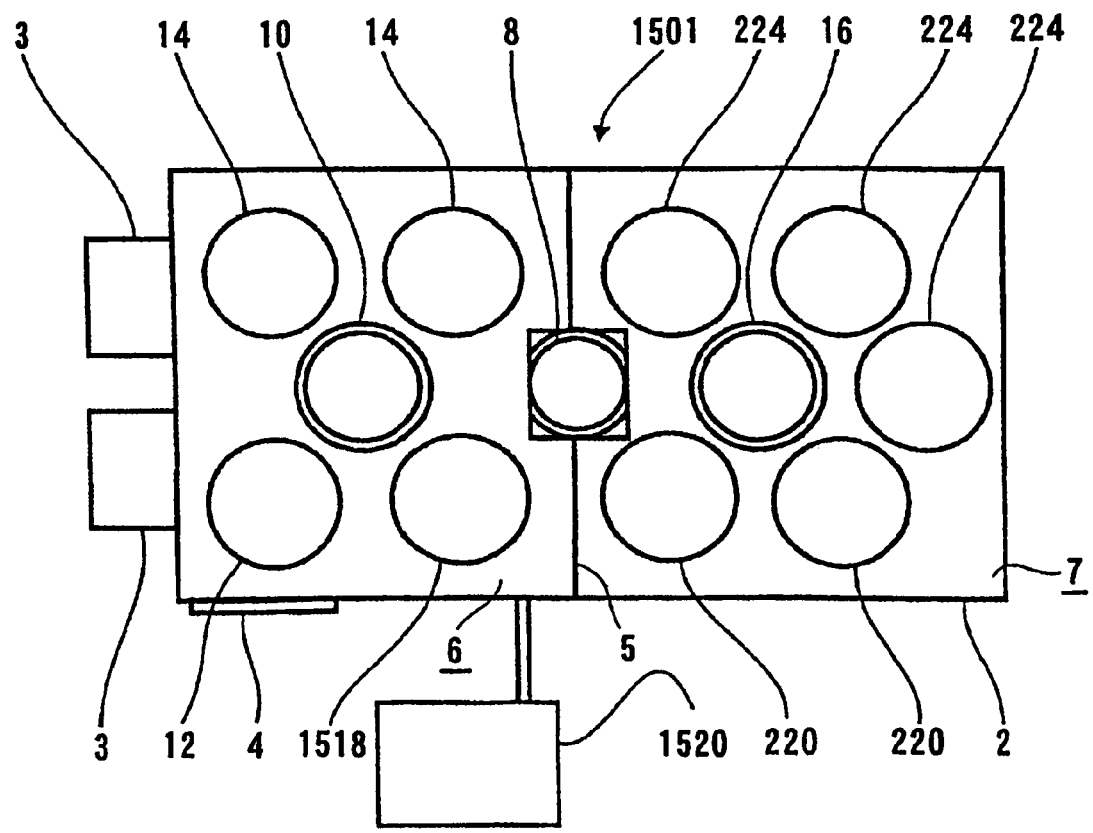
FIG. 31 is a plan view showing a plating apparatus according to a sixteenth embodiment of the present invention.

FIG. 31 illustrates a plating apparatus 1501 according to a sixteenth embodiment of the present invention. The plating apparatus 1501 has an electrolytic ionized water generator 1520 disposed outside of the frame 2 for generating electrolytic ionized water. Further, the plating apparatus 1501 has an electrolytic ionized water process chamber 1518 instead of the ultraviolet ray radiation chamber 218 disposed in the dry station area 6 of the plating apparatus 201 in the third embodiment shown in FIG. 10.

With the plating apparatus 1501 having the above arrangement, a substrate is aligned in a predetermined direction by the aligner 12 and transferred to the electrolytic ionized water process chamber 1518. In the electrolytic ionized water process chamber 1518, electrolytic ionized water generated by the electrolytic ionized water generator 1520 is brought into contact with a surface (to be plated) of the substrate. Thereafter, the first transfer robot 10 takes the substrate out of the electrolytic ionized water process chamber 1518 and transfers the substrate to the temporary placement stage 8. Then, the substrate is subjected to the subsequent processes as described above.

Anodic water (oxidized water) of electrolytic ionized water can remove any organic substance, and cathodic water (reduced water) of electrolytic ionized water can remove particles effectively. Accordingly, by bringing the surface of the substrate into contact with the electrolytic ionized water prior to the plating process, it is possible to improve the wettability of the surface of the substrate and effectively remove particles attached to the surface of the substrate so as to clean the surface of the substrate.

Figure 32:
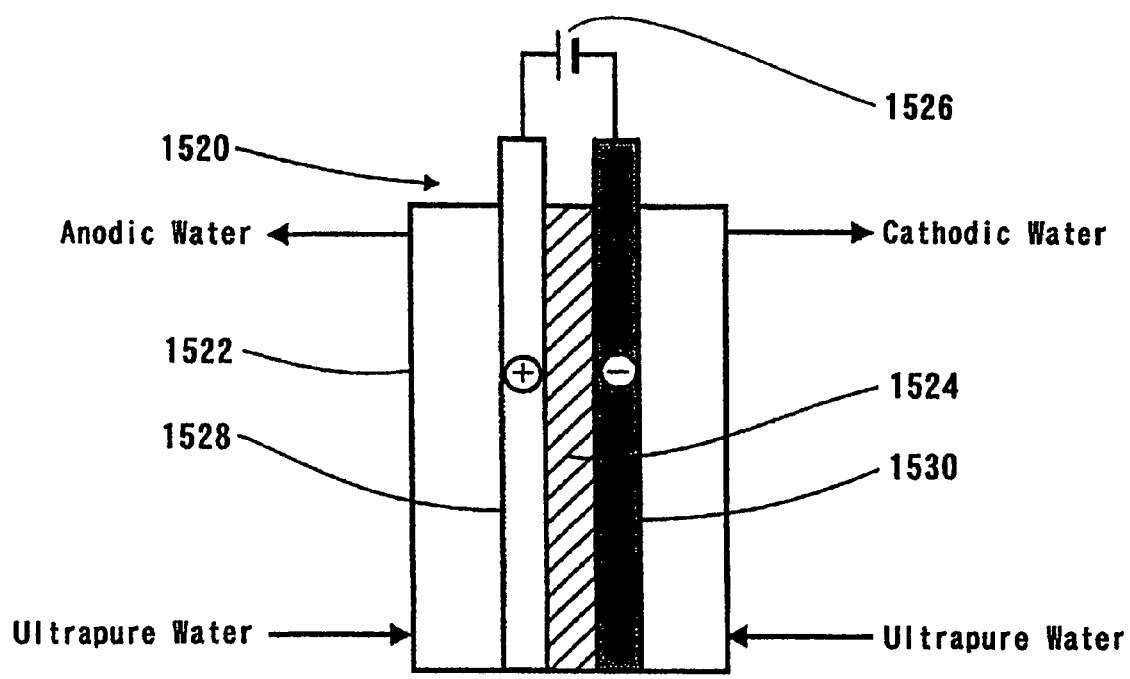
FIG. 32 is a schematic view showing an electrolytic ionized water generator in the plating apparatus shown in FIG. 31.

Electrolytic ionized water is generated from pure water by applying an electric field to the pure water. Although electrolytic ionized water has a pH of 7, it has a different oxidation-reduction potential than pure water. FIG. 32 illustrates an example of the electrolytic ionized water generator 1520 shown in FIG. 32. The electrolytic ionized water generator 1520 has an electrolytic cell 1522, a power source 1526, an anode plate 1528 connected to an anode of the power source 1526, a cathode plate 1530 connected to a cathode of the power source 1526, and a cation exchanger membrane 1524 interposed between the anode plate 1528 and the cathode plate 1530. Ultrapure water is introduced into the electrolytic cell 1522 from the anode side and from the cathode side and discharged from the electrolytic cell 1522 to the anode side and to the cathode side. Thus, anodic water and cathodic water of electrolytic ionized water is generated at the anode side and at the cathode side, respectively.

The anodic water contains oxygen dissolved therein, and the cathodic water contains hydrogen dissolved therein. Accordingly, the anodic water of the electrolytic ionized water has a mild oxidative function, and the cathodic water has a mild reductive function. Thus, the electrolytic ionized water can remove contaminants or particles while recovering damage of the substrate. Further, it is more effective to combine electrolytic ionized water and dilute chemical liquid. The electrolytic ionized water becomes normal water after it has been used in the electrolytic ionized water process chamber 1518. Even if only a trace of chemical liquid is added to the electrolytic ionized water, a great effect can be achieved. Therefore, it is possible to contribute to reduction of environmental loads.

FIG. 33 illustrates an example of the electrolytic ionized water process chamber 1518, which processes a substrate in a horizontal state. The electrolytic ionized water process chamber 1518 has substantially the same structure as the acid treatment chamber 20 shown in FIG. 3. The electrolytic ionized water process chamber 1518 differs from the acid treatment chamber 20 in that electrolytic ionized water 1532 is sprayed from spray heads 40 to an upper surface (to be plated) of the substrate W instead of the acid liquid 42.

Figure 34:
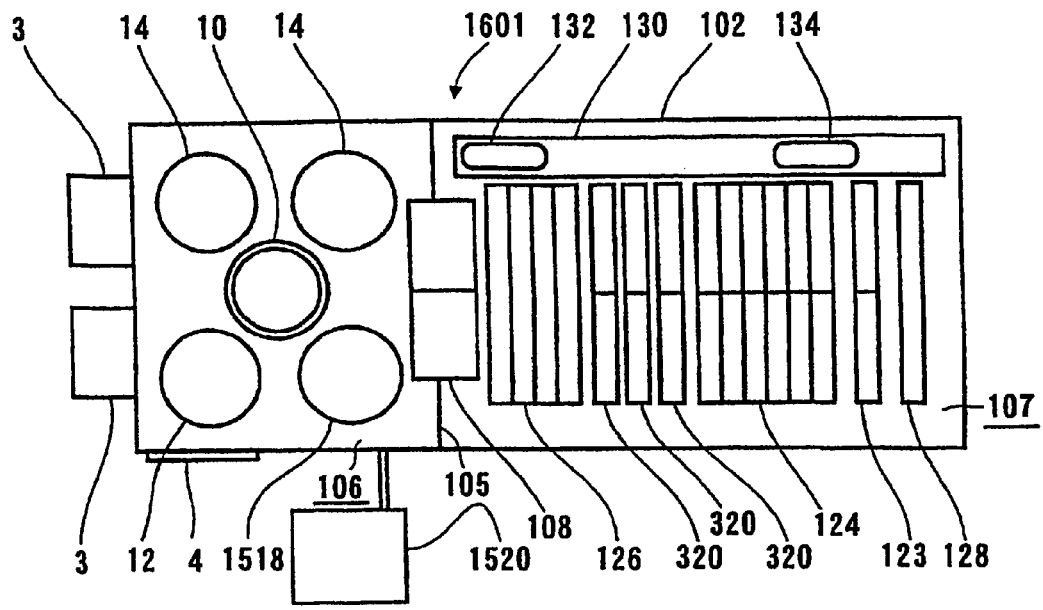
FIG. 34 is a plan view showing a plating apparatus according to a seventeenth embodiment of the present invention.

FIG. 34 illustrates a plating apparatus 1601 according to a seventeenth embodiment of the present invention. The plating apparatus 1601 has an electrolytic ionized water generator 1520 disposed outside of the frame 102 for generating electrolytic ionized water. Further, the plating apparatus 1601 has an electrolytic ionized water process chamber 1518 instead of the ultraviolet ray radiation chamber 218 disposed in the dry station area 106 of the plating apparatus 301 in the fourth embodiment shown in FIG. 14.

With the plating apparatus 1601 having the above arrangement, a substrate is aligned in a predetermined direction by the aligner 12 and transferred to the electrolytic ionized water process chamber 1518. In the electrolytic ionized water process chamber 1518, electrolytic ionized water generated by the electrolytic ionized water generator 1520 is brought into contact with a surface (to be plated) of the substrate. Thereafter, the first transfer robot 10 takes the substrate out of the electrolytic ionized water process chamber 1518 and transfers the substrate to the substrate loading stage 108. At the substrate loading stages 108, substrates are loaded into the substrate holders 136 (see FIG. 6). Then, the substrates are subjected to the subsequent processes in a vertical state as described above.

Figure 35:
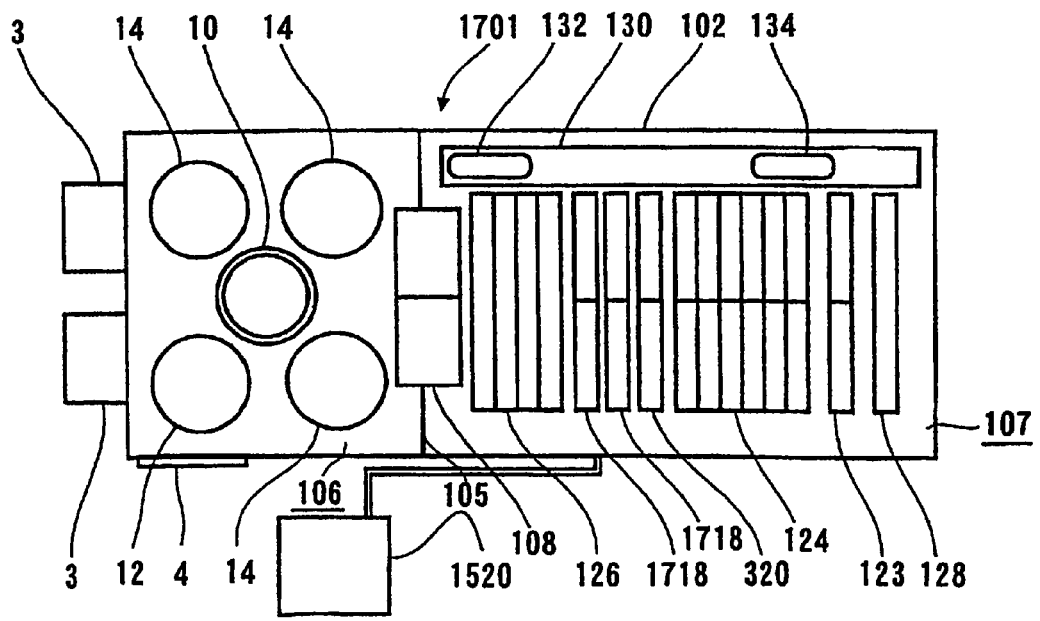
FIG. 35 is a plan view showing a plating apparatus according to an eighteenth embodiment of the present invention.

FIG. 35 illustrates a plating apparatus 1701 according to an eighteenth embodiment of the present invention. The plating apparatus 1701 has an electrolytic ionized water generator 1520 disposed outside of the frame 102 for generating electrolytic ionized water. The plating apparatus 1701 has two electrolytic ionized water process chambers 1718 instead of two of the rinsing chambers 320 disposed in the wet station area 107 of the plating apparatus 301 in the fourth embodiment shown in FIG. 14. Further, the plating apparatus 1701 has a cleaning and drying chamber 14 instead of the ultraviolet ray radiation chamber 218 disposed in the dry station area 106 of the plating apparatus 301 in the fourth embodiment shown in FIG. 14.

The rinsing chamber 320 is disposed downstream of the two electrolytic ionized water process chambers 1718. In each of the electrolytic ionized water process chambers 1718, electrolytic ionized water generated by the electrolytic ionized water generator 1520 is brought into contact with surfaces (to be plated) of the substrates. Thereafter, the substrates are subjected to a pre-treatment process (rinsing process) in the rinsing chamber 320. Then, a plating process is performed on the surfaces of the substrates in the plating chamber 124.

Figure 36:
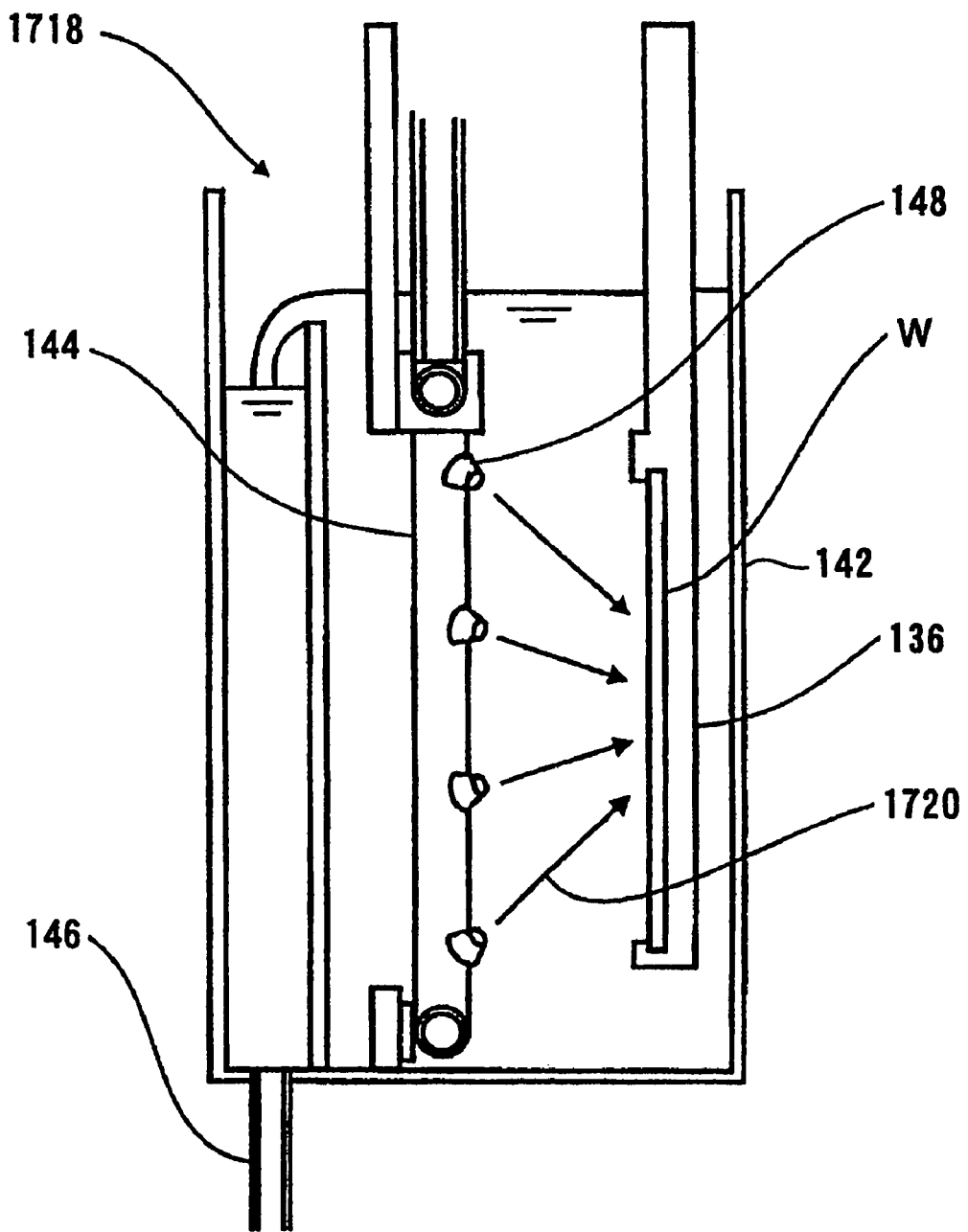
FIG. 36 is a schematic view showing an electrolytic ionized water process chamber in the plating apparatus shown in FIG. 35.

FIG. 36 illustrates an example of the electrolytic ionized water process chamber 1718, which processes substrates in a vertical state. The electrolytic ionized water process chamber 1718 has substantially the same structure as the acid treatment chamber 120 shown in FIG. 8. The electrolytic ionized water process chamber 1718 differs from the acid treatment chamber 120 in that electrolytic ionized water 1720 is ejected from ejection nozzles 148 to surfaces (to be plated) of the substrates W instead of the acid liquid 42.

Figure 37:
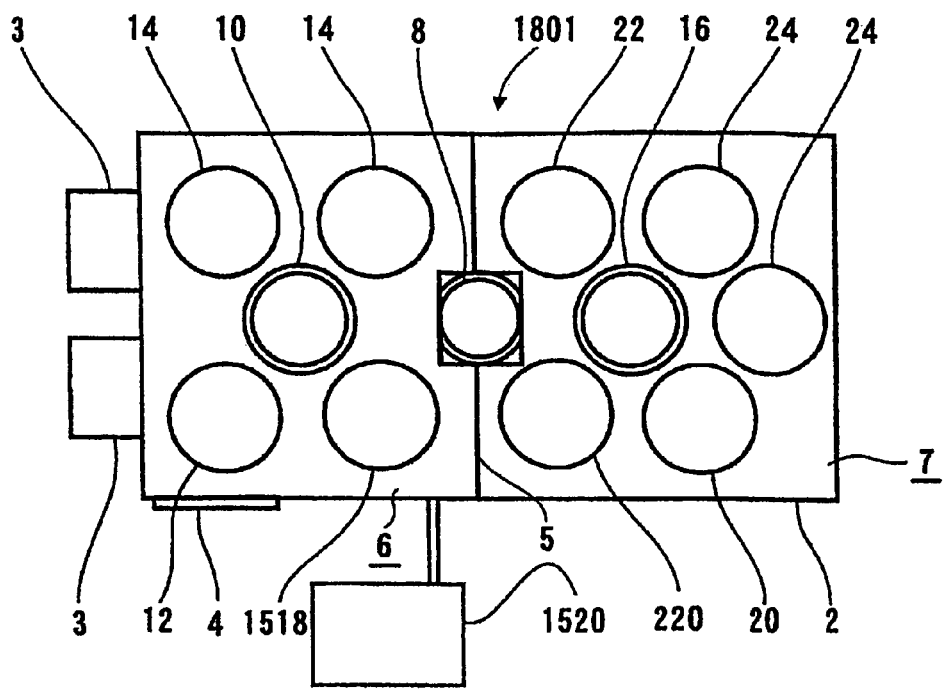
FIG. 37 is a plan view showing a plating apparatus according to a nineteenth embodiment of the present invention.

FIG. 37 illustrates a plating apparatus 1801 according to a nineteenth embodiment of the present invention. The plating apparatus 1801 has an acid treatment chamber 20 for processing the surface of the substrate with an acid liquid, instead of one of the two rinsing chamber 220 disposed in the wet station area 7 of the plating apparatus 1501 in the sixteenth embodiment shown in FIG. 31. Further, the three plating chambers 224 in the sixteenth embodiment, which also can roughly clean the substrate, are replaced with a cleaning chamber 22 and two plating chambers 24.

With the plating apparatus 1801 having the above arrangement, a substrate is subjected to a pre-treatment process of a rinsing process in the rinsing chamber 220 and transferred to the acid treatment chamber 20. In the acid treatment chamber 20, the substrate is processed with an acid liquid so as to activate a surface (to be plated) of the substrate. The substrate which has been subjected to the acid treatment is transferred to the cleaning chamber 22, where the surface of the substrate is cleaned. Then, the substrate is transferred to the plating chamber 24, where a plating process is performed on the surface of the substrate.

Figure 38:
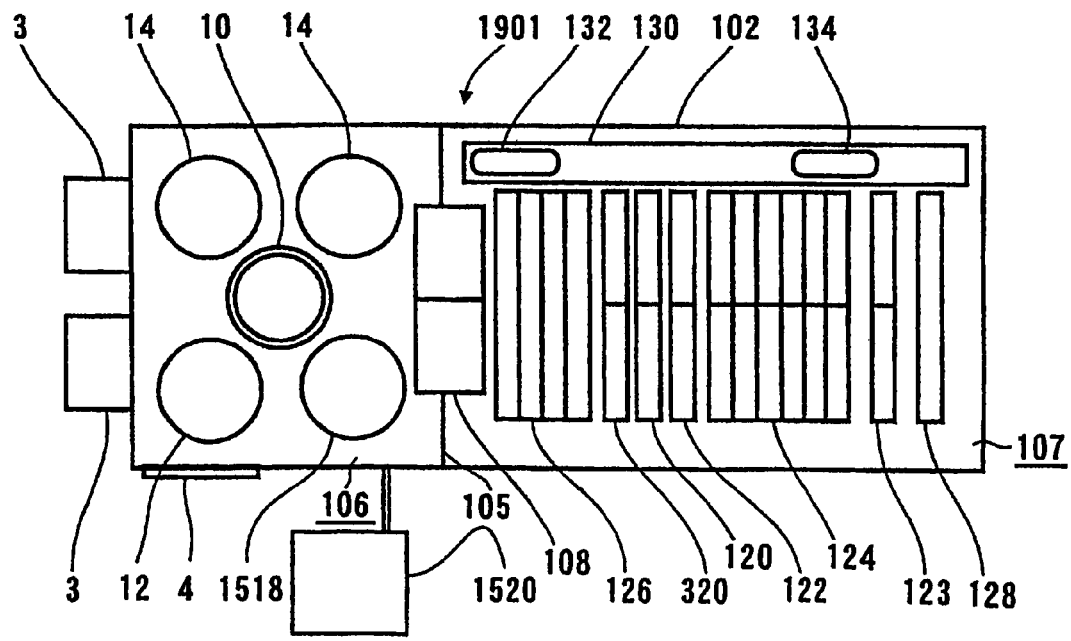
FIG. 38 is a plan view showing a plating apparatus according to a twentieth embodiment of the present invention.

FIG. 38 illustrates a plating apparatus 1901 according to a twentieth embodiment of the present invention. The plating apparatus 1901 has an acid treatment chamber 120 instead of one of the three rinsing chambers 320 disposed in the wet station area 107 of the plating apparatus 1601 in the seventeenth embodiment shown in FIG. 34. Further, the plating apparatus 1901 has a cleaning chamber 122 instead of the other of the rinsing chambers 320.

With the plating apparatus 1901 having the above arrangement, substrates are subjected to a pre-treatment process of a rinsing process in the rinsing chamber 320 and transferred to the acid treatment chamber 120. In the acid treatment chamber 120, the substrates are processed with an acid liquid so as to activate surfaces (to be plated) of the substrates. The substrates which have been subjected to the acid treatment are transferred to the cleaning chamber 122, where the surfaces of the substrates are cleaned. Then, the substrates are transferred to the plating chamber 124, where a plating process is performed on the surfaces of the substrates.

FIG. 39 illustrates a plating apparatus 2001 according to a twenty-first embodiment of the present invention. The plating apparatus 2001 has an alkalescent process chamber 2020 instead of one of the two rinsing chamber 220 disposed in the wet station area 7 of the plating apparatus 201 in the third embodiment shown in FIG. 10. Further, the plating apparatus 2001 has a cleaning and drying chamber 14 instead of the ultraviolet ray radiation chamber 218 disposed in the dry station area 6 of the plating apparatus 201 in the third embodiment shown in FIG. 10.

With the plating apparatus 2001 having the above arrangement, a substrate is plated and roughly cleaned (rinsed) in the plating chamber 224. Then, the substrate is transferred to the alkalescent process chamber 2020. In the alkalescent process chamber 2020, a surface of a plated film on the substrate is cleaned with an alkalescent aqueous solution. Thereafter, the substrate is returned to the temporary placement stage 8.

The alkalescent aqueous solution may comprise an alkalescent aqueous solution utilizing electrolytic ionized water, a trisodium phosphate solution, a tripotassium phosphate solution, or dilute ammonia water.

When interconnections or bumps for semiconductor circuits are formed in a silicon wafer or other substrates, copper, nickel, or solder is often used for the interconnections or bumps. In order to form such interconnections or bumps by plating, a strongly acidic plating liquid is used in many cases. After the plating process, a surface of a plated film on the substrate is generally cleaned with pure water. However, a small amount of acid components may remain on the surface of the substrate. If such acid components remain on the surface of the substrate, then the surface of the plated film is likely to be oxidized. In the present embodiment, the plated surface of the substrate is cleaned (rinsed) with the alkalescent aqueous solution in the alkalescent process chamber 2020 to neutralize acid components, which have not been cleaned with pure water and have remained on the plated surface of the substrate, with the alkalescent aqueous solution. Accordingly, it is possible to prevent disadvantages such as oxidation of the plated surface and alteration of the plated surface.

Figure 40:
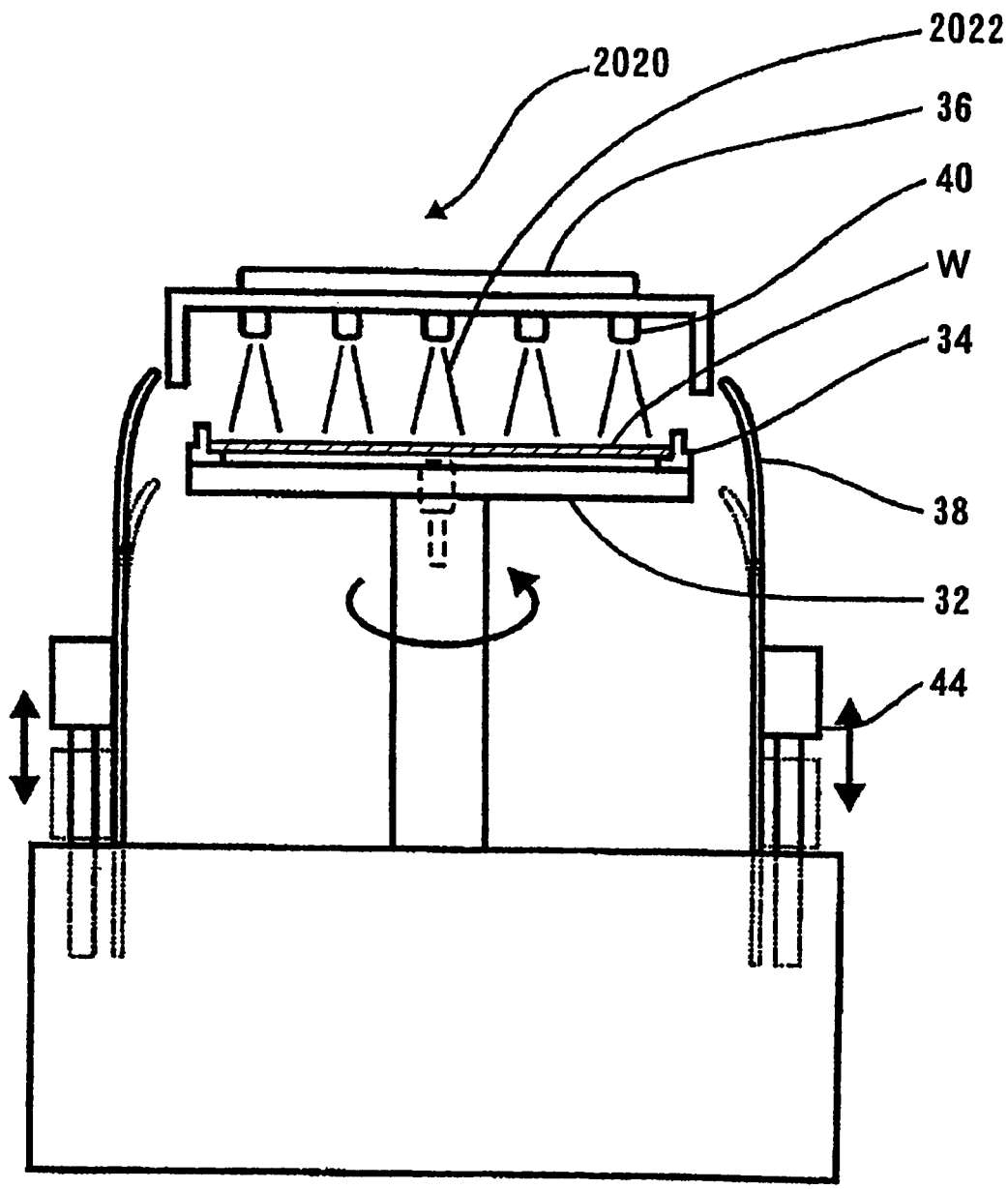
FIG. 40 is a schematic view showing an alkalescent process chamber in the plating apparatus shown in FIG. 39.

FIG. 40 illustrates an example of the alkalescent process chamber 2020, which processes a substrate in a horizontal state. The alkalescent process chamber 2020 has substantially the same structure as the acid treatment chamber 20 shown in FIG. 3. The alkalescent process chamber 2020 differs from the acid treatment chamber 20 in that alkalescent aqueous solution 2022 is sprayed from spray heads 40 to an upper surface (to be plated) of the substrate W instead of the acid liquid 42.

FIG. 41 illustrates a plating apparatus 2101 according to a twenty-second embodiment of the present invention. The plating apparatus 2101 has an alkalescent process chamber 2120 disposed between the plating chamber 124 and the cleaning chamber 123 in the wet station area 107 of the plating apparatus 301 in the fourth embodiment shown in FIG. 14. Further, the plating apparatus 2101 has a cleaning and drying chamber 14 instead of the ultraviolet ray radiation chamber 218 disposed in the dry station area 106 of the plating apparatus 301 in the fourth embodiment shown in FIG. 14.

With the plating apparatus 2101 having the above arrangement, substrates are plated in the plating chamber 124 and transferred to the alkalescent process chamber 2120. In the alkalescent process chamber 2120, surfaces of plated films on the substrates are cleaned with an alkalescent aqueous solution. Thereafter, the substrates are transferred to the cleaning chamber 123.

Figure 42:
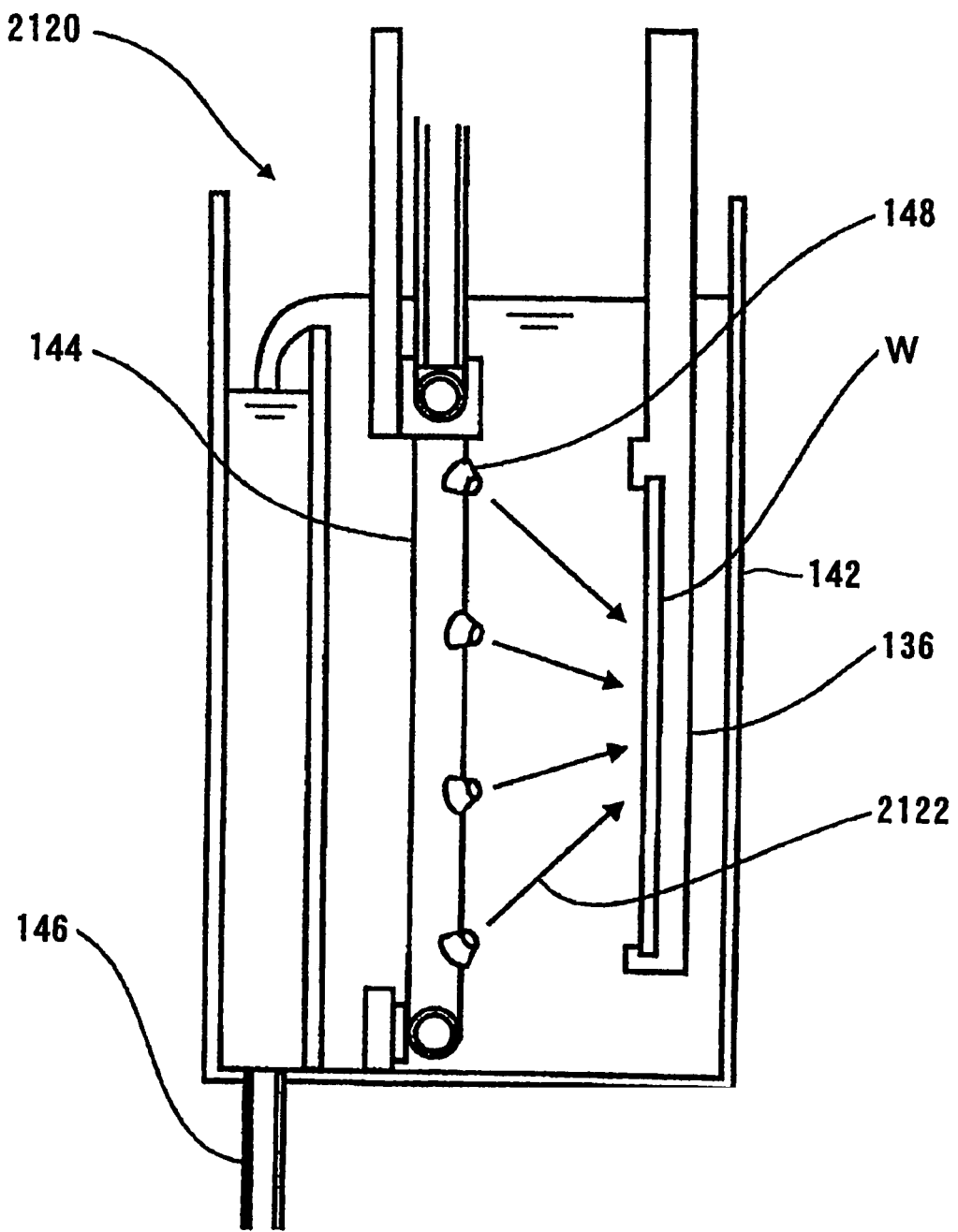
FIG. 42 is a schematic view showing an alkalescent process chamber in the plating apparatus shown in FIG. 41.

FIG. 42 illustrates an example of the alkalescent process chamber 2120, which processes substrates in a vertical state. The alkalescent process chamber 2120 has substantially the same structure as the acid treatment chamber 120 shown in FIG. 8. The alkalescent process chamber 2120 differs from the acid treatment chamber 120 in that alkalescent aqueous solution 2122 is ejected from ejection nozzles 148 to surfaces (to be plated) of the substrates W instead of the acid liquid 42.

Although certain preferred embodiments of the present invention have been shown and described in detail, it should be understood that various changes and modifications may be made therein without departing from the scope of the appended claims.

INDUSTRIAL APPLICABILITY

The present invention is suitably used for a plating method and apparatus for sequentially performing a plating process on a substrate such as a lead frame, a printed board, a flexible circuit, a tape substrate, or a semiconductor wafer used for electronics.

The invention claimed is:

1. A plating method comprising:
   holding a substrate by a substrate holder;
   plating a surface of the substrate held by the substrate holder with an acidic plating solution;
   cleaning the surface of the substrate held by the substrate holder with pure water after said plating process;
   producing an alkalescent aqueous solution by:
      generating cathodic water by electrolysis of pure water; and
      adding a tripotassium phosphate solution to the cathodic water;
   cleaning the surface of the substrate held by the substrate holder with the alkalescent aqueous solution after said plating process;
   removing the plated substrate from the substrate holder; and then
   cleaning and drying the plated surface of the substrate.

2. The plating method as recited in claim 1, further comprising bringing the surface of the substrate into contact with ozone water so as to improve the wettability of the surface of the substrate before said plating process.

3. The plating method as recited in claim 2, further comprising bringing the surface of the substrate into contact with an acid liquid after said bringing process with the ozone water before said plating process.

4. The plating method as recited in claim 2, further comprising dissolving an ozone gas in pure water by diffusion and dissolution through an ozone dissolution membrane to generate the ozone water.

5. The plating method as recited in claim 1, further comprising bringing the surface of the substrate into contact with electrolytic ionized water so as to improve the wettability of the surface of the substrate before said plating process.

6. The plating method as recited in claim 5, further comprising bringing the surface of the substrate into contact with an acid liquid after said bringing the surface of the substrate into contact with the electrolytic ionized water before said plating process.

7. The plating method as recited in claim 5, wherein the electrolytic ionized water comprises at least one of anodic water and cathodic water generated by electrolysis of pure water or a solution containing an electrolyte.

8. The plating method as recited in claim 1, wherein the substrate has an organic resist film with a predetermined pattern formed in the organic resist film.

9. The plating method as recited in claim 1, wherein the alkalescent aqueous solution consists of the cathodic water and the tripotassium phosphate solution.

10. The plating method as recited in claim 1, wherein said cleaning the surface of the substrate held by the substrate holder with the alkalescent aqueous solution after said plating process comprises spraying the alkalescent aqueous solution on to the surface of the substrate.

11. The plating method as recited in claim 1, wherein, during said holding of the substrate by the substrate holder, the substrate is transferred between stations together with the substrate holder.

* * * * *